(12) United States Patent
Kim et al.

(10) Patent No.: US 10,065,402 B2
(45) Date of Patent: Sep. 4, 2018

(54) METHOD OF MANUFACTURING PELLICLE ASSEMBLY AND METHOD OF PHOTOMASK ASSEMBLY INCLUDING THE SAME

(71) Applicant: SAMSUNG ELECTRONICS CO., LTD., Suwon-si, Gyeonggi-do (KR)

(72) Inventors: Mun Ja Kim, Suwon-si (KR); Byung-Gook Kim, Seoul (KR); Hwan Chul Jeon, Seoul (KR); Ji-Beom Yoo, Seoul (KR); Dong-Wook Shin, Changwon-si (KR); Taesung Kim, Suwon-si (KR); Sooyoung Kim, Suwon-si (KR)

(73) Assignees: SAMSUNG ELECTRONICS CO., LTD., Suwon-si, Gyeonggi-do (KR); RESEARCH & BUSINESS FOUNDATION SUNGKYUNK WAN UNIVERSITY, Suwon-si, Gyeonggi-do (KR)

( * ) Notice: Subject to any disclaimer, the term of this patent is extended or adjusted under 35 U.S.C. 154(b) by 102 days.

(21) Appl. No.: 15/014,054

(22) Filed: Feb. 3, 2016

(65) Prior Publication Data

US 2016/0355001 A1    Dec. 8, 2016

(30) Foreign Application Priority Data

Jun. 4, 2015 (KR) .................. 10-2015-0079200

(51) Int. Cl.
  *B32B 37/14* (2006.01)
  *B32B 38/18* (2006.01)
  (Continued)

(52) U.S. Cl.
  CPC .............. *B32B 37/025* (2013.01); *G03F 1/62* (2013.01); *B32B 37/0038* (2013.01);
  (Continued)

(58) Field of Classification Search
  CPC ........ B32B 2038/166; B32B 2305/026; B32B 2457/08; B32B 37/0038; B32B 37/025;
  (Continued)

(56) References Cited

U.S. PATENT DOCUMENTS 5,643,654 A    7/1997 Fujita et al.
8,916,057 B2   12/2014 Hong et al.
(Continued)

FOREIGN PATENT DOCUMENTS

JP    2006-163215 A    6/2006
JP    2006163215 A  *  6/2006
(Continued)

OTHER PUBLICATIONS

Translation of KR20110031864.*
(Continued)

*Primary Examiner* — Sonya Mazumdar
(74) *Attorney, Agent, or Firm* — Lee & Morse, P.C.

(57) ABSTRACT

A method of manufacturing a pellicle assembly, the method including attaching a carbon-containing thin film onto a transfer membrane in a wet atmosphere; attaching the carbon-containing thin film to a pellicle frame in a dry atmosphere while the carbon-containing thin film is attached onto the transfer membrane; and separating the transfer membrane from the carbon-containing thin film while the carbon-containing thin film is attached to the pellicle frame.

19 Claims, 37 Drawing Sheets

(51) Int. Cl.

| | | |
|---|---|---|
| *B32B 37/00* | (2006.01) | |
| *G03F 1/62* | (2012.01) | |
| *B32B 37/10* | (2006.01) | |
| *B32B 38/10* | (2006.01) | |
| *B32B 37/12* | (2006.01) | |
| *H01L 21/00* | (2006.01) | |
| *B32B 38/16* | (2006.01) | |

(52) U.S. Cl.
 CPC ............... *B32B 37/12* (2013.01); *B32B 37/14* (2013.01); *B32B 38/10* (2013.01); *B32B 2038/166* (2013.01); *B32B 2305/026* (2013.01); *B32B 2457/08* (2013.01); *H01L 21/00* (2013.01)

(58) Field of Classification Search
 CPC ......... B32B 37/12; B32B 37/14; B32B 38/10; H01L 21/00; G03F 1/62
 USPC .................................................. 156/247, 249
 See application file for complete search history.

(56) References Cited

U.S. PATENT DOCUMENTS

| | | | |
|---|---|---|---|
| 2004/0079726 A1 | 4/2004 | Tabery et al. | |
| 2006/0246234 A1* | 11/2006 | Meyers | G03F 1/64 428/14 |
| 2013/0065022 A1* | 3/2013 | Seo | H01L 29/1606 428/167 |
| 2015/0068684 A1 | 3/2015 | Hong et al. | |

FOREIGN PATENT DOCUMENTS

| | | | | |
|---|---|---|---|---|
| KR | 10-2010-0116105 A | | 10/2010 | |
| KR | 20100116105 A | * | 10/2010 | |
| KR | 10-2011-0031864 A | | 3/2011 | |
| KR | 20110031864 A | * | 3/2011 | |
| KR | 10-2013-0088565 A | | 8/2013 | |
| KR | 10-2014-0057079 A | | 5/2014 | |
| WO | WO 2011/046415 A2 | | 4/2011 | |
| WO | WO 2014/100012 A1 | | 6/2014 | |

OTHER PUBLICATIONS

Translation of KR20100116105.*
Translation of JP2006163215.*
Zhou, et al., "Electrostatic Graphene Loudspeaker," Applied Physics Letters 102, 223109 (2013).

* cited by examiner

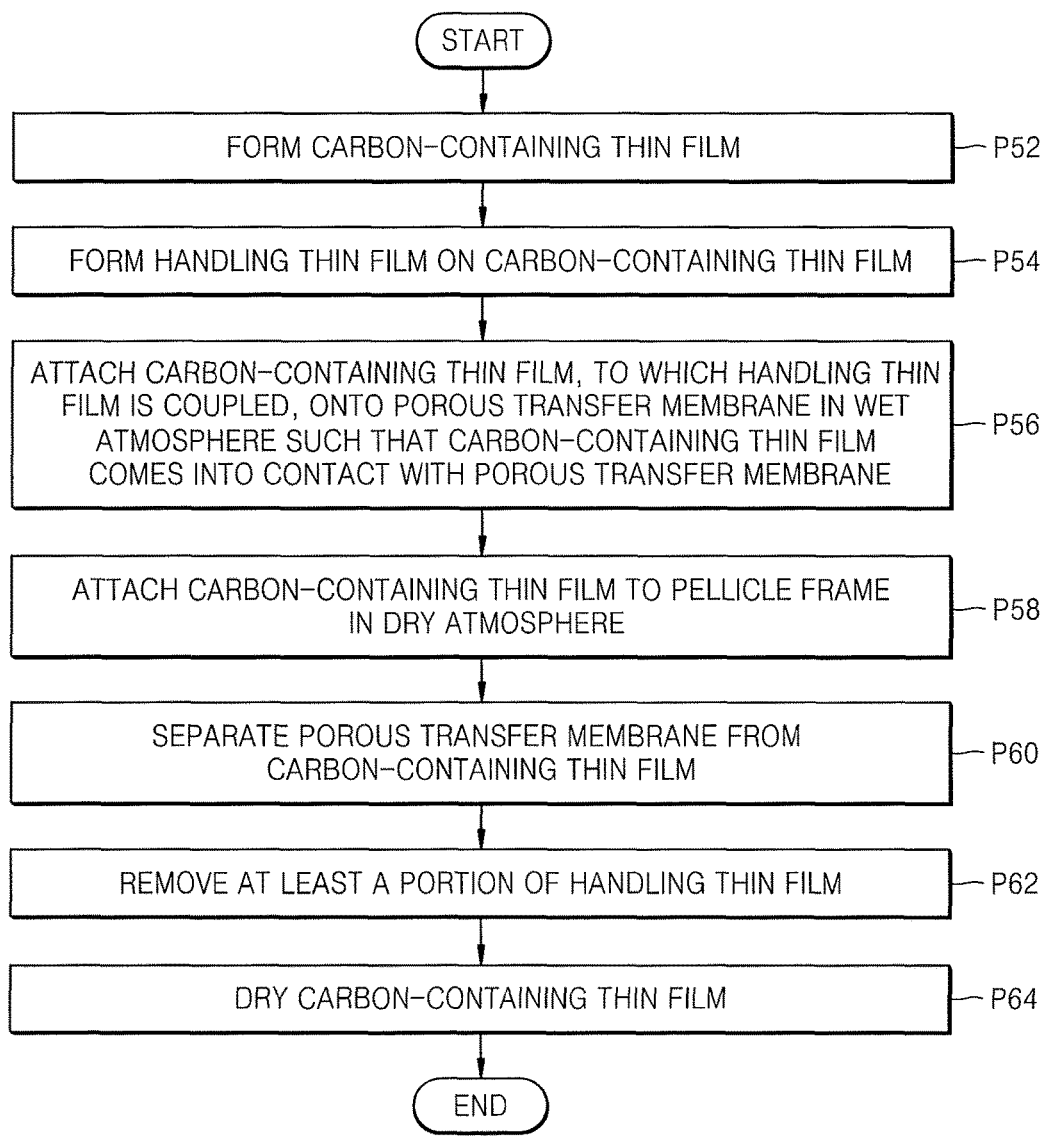

METHOD OF MANUFACTURING PELLICLE ASSEMBLY AND METHOD OF PHOTOMASK ASSEMBLY INCLUDING THE SAME

CROSS-REFERENCE TO RELATED APPLICATION

Korean Patent Application No. 10-2015-0079200, filed on Jun. 4, 2015, in the Korean Intellectual Property Office, and entitled: "Method of Manufacturing Pellicle Assembly and Method of Photomask Assembly Including the Same," is incorporated by reference herein in its entirety.

BACKGROUND

1. Field

Embodiments relate to a method of manufacturing an integrated circuit device.

2. Description of the Related Art

In a process of manufacturing an integrated circuit device, a lithography process may be used to form a circuit pattern onto a wafer. In the lithography process, a photomask may be used to transfer a desired pattern onto the wafer. When the photomask is contaminated with foreign materials such as particles of a surrounding environment or is deformed by the surrounding environment, defects may be generated on the wafer onto which a photomask pattern may be transferred.

SUMMARY

Embodiments may be realized by providing a method of manufacturing a pellicle assembly, the method including attaching a carbon-containing thin film onto a transfer membrane in a wet atmosphere; attaching the carbon-containing thin film to a pellicle frame in a dry atmosphere while the carbon-containing thin film is attached onto the transfer membrane; and separating the transfer membrane from the carbon-containing thin film while the carbon-containing thin film is attached to the pellicle frame.

The method may further include, after separating the transfer membrane from the carbon-containing thin film, drying the carbon-containing thin film.

The method may further include, before attaching the carbon-containing thin film onto the transfer membrane or after separating the transfer membrane from the carbon-containing thin film, decreasing a thickness of the carbon-containing thin film.

Decreasing the thickness of the carbon-containing thin film may be performed using a plasma etching process performed in an oxygen or hydrogen atmosphere.

Attaching the carbon-containing thin film onto the transfer membrane in the wet atmosphere may include dipping the carbon-containing thin film in a liquid; and attaching the carbon-containing thin film onto the transfer membrane while at least a portion of the carbon-containing thin film is dipped in the liquid.

Attaching the carbon-containing thin film onto the transfer membrane may include attaching the carbon-containing thin film onto the transfer membrane using a surface tension and a capillary phenomenon of a liquid.

The transfer membrane may include a plurality of pores penetrating the transfer membrane, and each of the plurality of pores may have a pore size of about 10 nm to about 20 µm.

The transfer membrane may include a transparent film or a translucent film.

The transfer membrane may include a porous polymer film.

Embodiments may be realized by providing a method of manufacturing a pellicle assembly, the method including forming a handling thin film on a first surface of a carbon-containing thin film; attaching the carbon-containing thin film onto a transfer membrane in a wet atmosphere, while maintaining the handling thin film on the carbon-containing thin film; attaching the carbon-containing thin film to a pellicle frame in a dry atmosphere while the carbon-containing thin film is attached onto the transfer membrane; separating the transfer membrane from the carbon-containing thin film while the carbon-containing thin film is attached to the pellicle frame; and removing at least a portion of the handling thin film.

Forming the handling thin film may include coating a polymer film on the first surface of the carbon-containing thin film.

Attaching the carbon-containing thin film onto the transfer membrane may include attaching the carbon-containing thin film onto the transfer membrane such that the transfer membrane faces the first surface of the carbon-containing thin film with the handling thin-film between the transfer membrane and the first surface of the carbon-containing thin film.

Attaching the carbon-containing thin film onto the transfer membrane may include attaching the carbon-containing thin film onto the transfer membrane such that the transfer membrane faces a second surface of the carbon-containing thin film, the second surface of the carbon-containing thin film being opposite to the first surface of the carbon-containing thin film.

Attaching the carbon-containing thin film onto the transfer membrane may be performed using a surface tension and a capillary phenomenon of a liquid.

Removing at least the portion of the handling thin film may be performed using a plasma etching process performed in an oxygen or hydrogen atmosphere.

Embodiments may be realized by providing a method of manufacturing a pellicle assembly, the method including attaching a carbon-containing thin film onto a transfer membrane in a liquid environment, attaching the carbon-containing thin film onto one surface of a pellicle frame in a gas environment while the carbon-containing thin film is attached onto the transfer membrane, separating the transfer membrane from the carbon-containing thin film while the carbon-containing thin film is attached onto the pellicle frame, and fixing a photomask to the other surface of the pellicle frame.

The method may further include, before attaching the carbon-containing thin film onto the transfer membrane, forming a handling thin film on the carbon-containing thin film. Attaching carbon-containing thin film onto the transfer membrane may include attaching the carbon-containing thin film onto the transfer membrane while the carbon-containing thin film is spaced apart from the transfer membrane with the handling thin film between the carbon-containing thin film and the transfer membrane.

The method may further include, after separating the transfer membrane from the carbon-containing thin film, removing the handling thin film from the carbon-containing thin film.

The method may further include, after separating the transfer membrane from the carbon-containing thin film, decreasing a thickness of the carbon-containing thin film.

The transfer membrane may include a plurality of pores, and attaching the carbon-containing thin film onto the transfer membrane may include attaching the carbon-containing thin film onto the transfer membrane using a surface tension and a capillary phenomenon of a liquid.

BRIEF DESCRIPTION OF THE DRAWINGS

Features will become apparent to those of skill in the art by describing in detail exemplary embodiments with reference to the attached drawings in which:

FIG. 7 illustrates a flowchart of a method of manufacturing a pellicle assembly, according to an exemplary embodiment;

DETAILED DESCRIPTION

Figure 1:
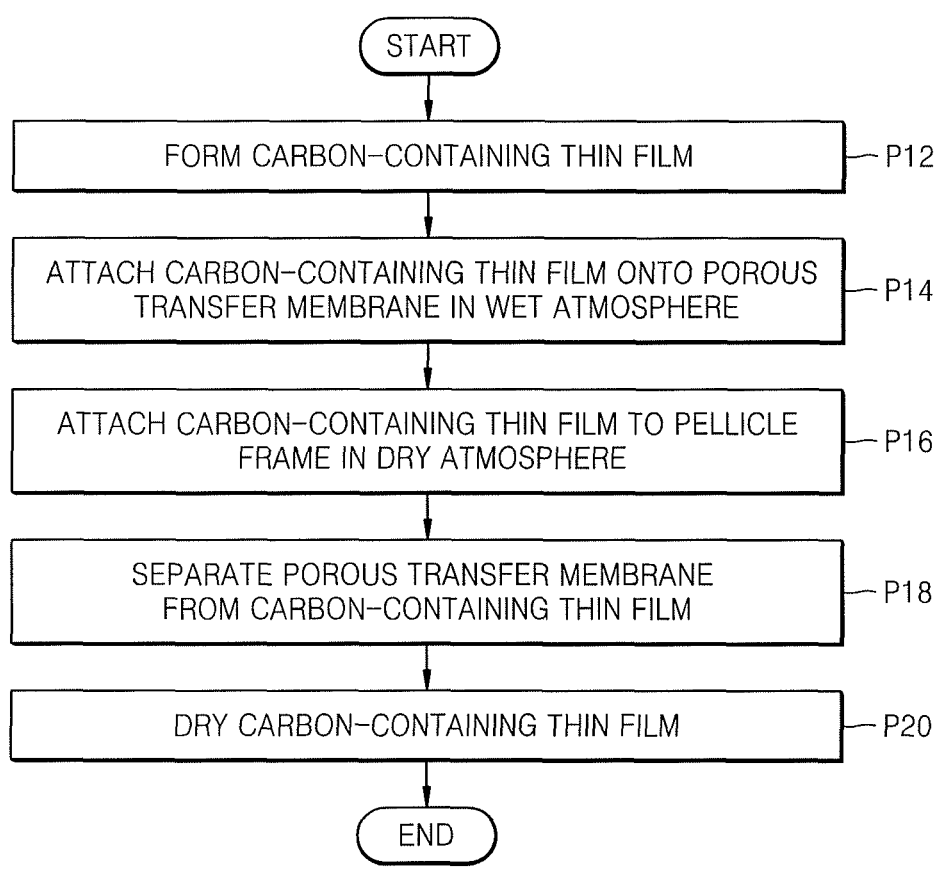
FIG. 1 illustrates a flowchart of a method of manufacturing a pellicle assembly, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of features may be exaggerated for clarity of illustration. Like reference numerals refer to like elements throughout. Expressions such as "at least one of", when preceding a list of elements, modify the entire list of elements and do not modify the individual elements of the list.

Also, though terms "first" and "second" are used to describe various members, components, regions, layers, and/or portions in various embodiments, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

In the accompanying drawings, the modifications of the illustrated shapes may be expected according to manufacturing technologies and/or tolerance. Therefore, the exemplary embodiments should not be construed as being limited to specific shapes of the illustrated regions. The shapes may be changed during the manufacturing processes.

FIG. 1 illustrates a flowchart of a method of manufacturing a pellicle assembly 100 (refer to FIG. 2I), according to an embodiment.

FIGS. 2A to 2I illustrate views of the method of manufacturing the pellicle assembly illustrated in FIG. 1, according to an exemplary embodiment.

Referring to FIG. 1, in process P12, a carbon-containing thin film 120 may be formed.

Figure 2A:
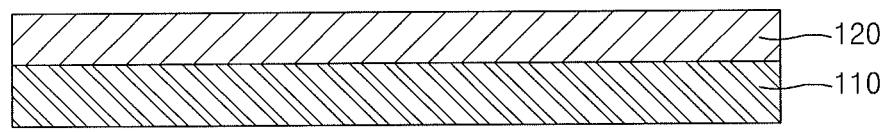
FIGS. 2A to 2I illustrate views of a method of manufacturing a pellicle assembly, according to an exemplary embodiment.
Figure 2B:
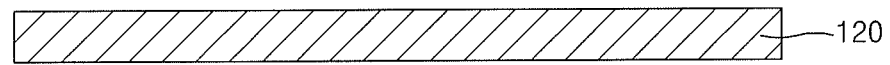

In a process P12, processes of FIGS. 2A and 2B may be performed to form the carbon-containing thin film 120.

Referring to FIG. 2A, the carbon-containing thin film 120 may be formed on a support substrate 110.

In some exemplary embodiments, the support substrate 110 may include a nickel (Ni) foil, a copper (Cu) foil, or a Ni/Cu foil.

In some exemplary embodiments, the carbon-containing thin film 120 may include a graphene layer with about 1 to about 10 layers, each of which may have a plane sheet of carbon atoms forming a honeycomb crystal lattice. In some exemplary embodiments, the carbon-containing thin film 120 may include graphite having a thickness of about 10 nm to about 200 nm.

In a process of forming the carbon-containing thin film 120 on the support substrate 110, the support substrate 110 may be heat-treated in an atmosphere including a hydrogen gas or a hydrocarbon gas. The hydrocarbon gas may include, for example, a methane ($CH_4$) gas or an acetylene ($C_2H_2$) gas. The heat-treatment may be performed at a temperature of, for example, about 750° C. to about 1100° C.

In some exemplary embodiments, after the carbon-containing thin film 120 is formed on the support substrate 110, a process may be further performed which may decrease a thickness of the carbon-containing thin film 120. For example, in order to form a thin film that is thin enough to transmit extreme ultraviolet (EUV) light or an electron beam, which may have a wavelength of about 6.75 nm to about 13.5 nm, the thickness of the carbon-containing thin film 120 may be decreased in a state in which, e.g., while, the carbon-containing thin film 120 is formed on the support substrate 110. In order to decrease the thickness of the carbon-containing thin film 120, the carbon-containing thin film 120 may be removed from an upper surface thereof to a predetermined depth by performing an etching process in a plasma etching atmosphere that may be performed in an oxygen or hydrogen atmosphere.

In some exemplary embodiments, after the carbon-containing thin film 120 is formed on the support substrate 110, a subsequent process described with reference to FIG. 2B may be performed without performing the process of decreasing the thickness of the carbon-containing thin film 120.

Referring to FIG. 2B, the support substrate 110 may be removed by using an etchant.

Examples of the etchant may include, for example, one or more of an iron III chloride ($FeCl_3$) aqueous solution, an ammonium persulfate ($(NH_4)_2S_2O_8$) aqueous solution, or a ceric ammonium nitrate ($(NH_4)_2Ce(NO_3)_6$) aqueous solution. In some exemplary embodiments, the support substrate 110 may be separated from the carbon-containing thin film 120 by using the etchant. The carbon-containing thin film 120 may be taken out from the etchant, metal impurities remaining in the carbon-containing thin film 120 may be removed by using an etching solution, and the carbon-containing thin film 120 may be rinsed by using an organic solvent such as acetone or deionized water (DIW).

In some exemplary embodiments, the etching solution may include, for example, a hydrochloric acid, a nitric acid, a sulfuric acid, an acetic acid, a hydrofluoric acid, aqua regia, or combinations thereof.

In process P14 of FIG. 1, the carbon-containing thin film 120 may be attached onto a porous transfer membrane in a wet atmosphere.

Figure 2C:
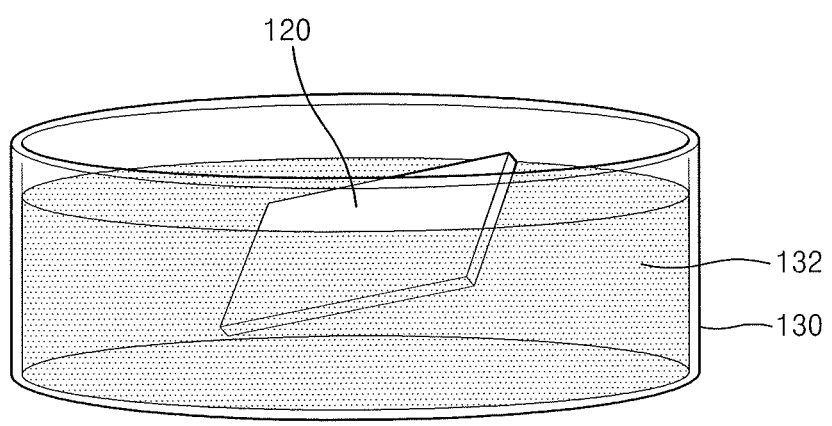
Figure 2D:
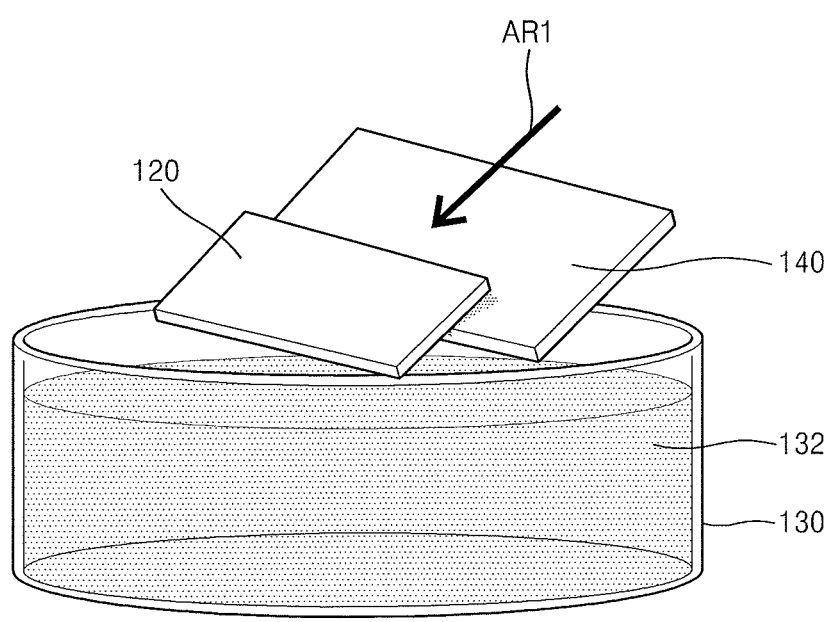

Processes illustrated in FIGS. 2C and 2D may be performed to attach the carbon-containing thin film 120 onto the porous transfer membrane in the wet atmosphere, according to the process P14.

Referring to FIG. 2C, the carbon-containing thin film 120 formed in the process P12 may be dipped in a liquid 132 contained in a container 130.

The liquid 132 may include DIW, an organic solvent, or a combination thereof. In some exemplary embodiments, the liquid 132 may include only DIW. In some exemplary embodiments, the liquid 132 may include a mixture of DIW and an organic solvent. A rinse liquid, which may be used to rinse the carbon-containing thin film 120 described with respect to FIG. 2B, may be used as the liquid 132.

Referring to FIG. 2D, in a state in which the carbon-containing thin film 120 is dipped in the liquid 132 contained in the container 130, the porous transfer membrane 140 may be dipped in the liquid 132 in an arrow direction AR1 to attach the carbon-containing thin film 120 onto the porous transfer membrane 140.

A resultant structure, in which the carbon-containing thin film 120 is attached onto the porous transfer membrane 140, may be taken out from the liquid 132.

A surface tension and a capillary phenomenon of the liquid 132 may be used to attach the carbon-containing thin film 132 onto the porous transfer membrane 140 in the liquid 132.

In order to attach the carbon-containing thin film 120 onto the porous transfer membrane 140, dipping the porous transfer membrane 140 in the liquid 132 may be performed, for example, as illustrated in FIG. 2D, in a state in which the carbon-containing thin film 120 is dipped in the liquid 132 contained in the container 130. In embodiments, in a state in which the carbon-containing thin film 120 is placed in the atmosphere rather than in the liquid 132, the carbon-containing thin film 120 may be attached onto the porous transfer membrane 140 by using a surface tension and a capillary phenomenon or a van der Waals force of DIW. Before the carbon-containing thin film 120 is attached onto the porous transfer membrane 140, a liquid may be previously sprayed on a surface of the porous transfer membrane 140, to which the carbon-containing thin film 120 may be attached.

Figure 2E:
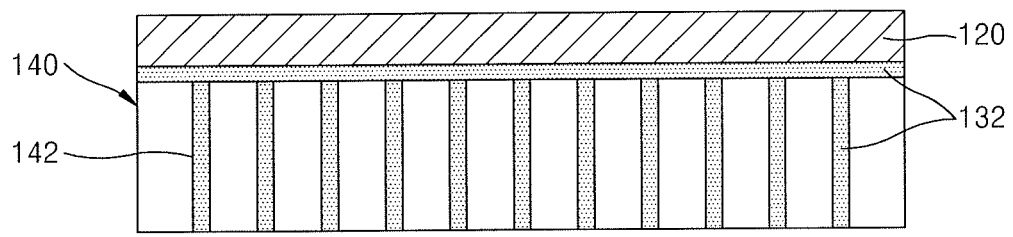

FIG. 2E illustrates a cross-sectional view of a state in which the carbon-containing thin film 120 is attached onto the porous transfer membrane 140.

Referring to FIG. 2E, the porous transfer membrane 140 may have a plurality of pores 142 penetrating the porous transfer membrane 140.

Each of the plurality of pores 142 may have an average pore size of about 10 nm to about 20 μm. In some exemplary embodiments, the plurality of pores 142 may be perpendicular to an extending direction of a principal surface of the porous transfer membrane 140. In some exemplary embodiments, the plurality of pores 142 may penetrate the porous transfer membrane 140 in a thickness direction, and a penetration path may not be a linear shape.

In some exemplary embodiments, the porous transfer membrane 140 may have a pore density of about $1 \times 10^4$ pores/cm$^2$ to about $1 \times 10^9$ pores/cm$^2$. In some exemplary embodiments, the plurality of pores 142 defined in the porous transfer membrane 140 may have a plane shape of a circle, an oval, a polygon such as a triangle, a quadrangle, or a hexagon, or combinations thereof.

An outer surface of the porous transfer membrane 140 may have a hydrophilic property or a hydrophobic property.

The porous transfer membrane 140 may include a transparent film or a translucent film, and in a state in which the carbon-containing thin film 120 is attached onto the porous transfer membrane 140, even when the carbon-containing thin film 120 is fully covered with the porous transfer membrane 140, a shape or an outline of the carbon-containing thin film 120 may be visible to the naked eye when viewed from the porous transfer membrane 140.

In some exemplary embodiments, the porous transfer membrane 140 may include a polycarbonate membrane filter. In some exemplary embodiments, the porous transfer membrane 140 may include one or more of nylon or cellulose. According to an exemplary embodiment, the porous transfer membrane 140 may include a porous polymer film with various materials.

The resultant structure, in which the carbon-containing thin film 120 is attached onto the porous transfer membrane 140, may be in a state in which the liquid 132 fills a space between the porous transfer membrane 140 and the carbon-containing thin film 120 and fills at least a portion of inner spaces of the plurality of pores 142. Due to, for example, the surface tension and the capillary phenomenon of the liquid 132 filling the space between the porous transfer membrane 140 and the carbon-containing thin film 120, the carbon-containing thin film 120 may be maintained in a state of being attached onto the porous transfer membrane 140.

As illustrated in FIG. 2E, the resultant structure, in which the carbon-containing thin film 120 is attached onto the porous transfer membrane 140, may be dried in the atmosphere for several seconds to several tens of minutes. The resultant structure may be dried such that the liquid 132 remains between the porous transfer membrane 140 and the carbon-containing thin film 120 and remains in at least a portion of the inner spaces of the plurality of pores 142 in the porous transfer membrane 140.

In process P16 of FIG. 1, while the carbon-containing thin film 120 is maintained in a state of being attached onto the porous transfer membrane 140, the carbon-containing thin film 120 may be attached to a pellicle frame 150 in a dry atmosphere.

Figure 2F:
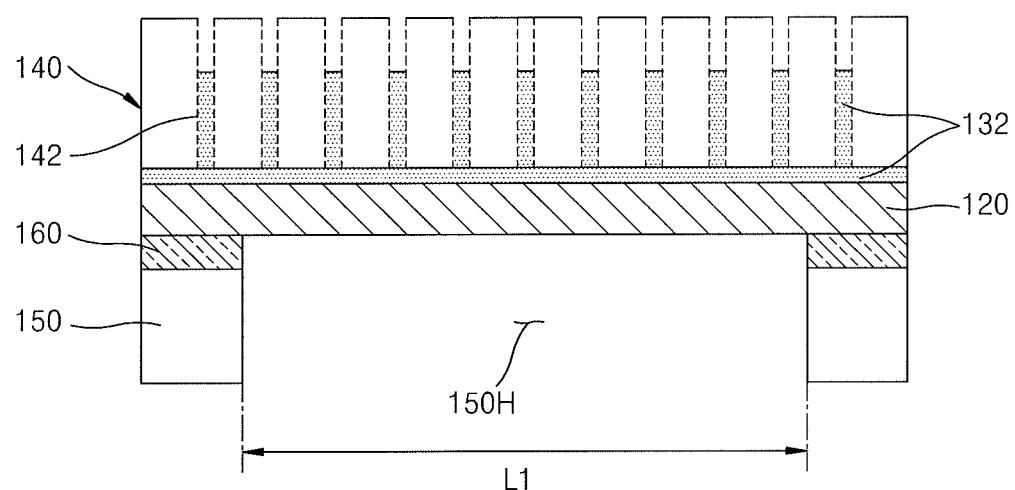

FIG. 2F illustrates a cross-sectional view of a state in which the carbon-containing thin film 120 is attached to the pellicle frame 150 in the dry atmosphere in a state in which the carbon-containing thin film 120 is maintained in a state of being attached onto the porous transfer membrane 140.

Referring to FIG. 2F, an adhesion layer 160 may be used to attach the carbon-containing thin film 120 to the pellicle frame 150.

In some exemplary embodiments, an opening 15014 defined at a central portion of the pellicle frame 150 may have a width L1 of about 50 mm to about 150 mm. For example, the opening 150H may have a square shape with a size of about 50 mm×50 mm, a rectangular shape with a size of about 50 mm×80 mm, or a rectangular shape with a size of about 110 mm×140 mm.

The carbon-containing thin film 120 and the porous transfer membrane 140 may have a sufficiently large size to fully cover the opening 150H. A plane size of the carbon-containing thin film 120 and the porous transfer membrane 140 may be greater than a plane size of the opening 150H. For example, the porous transfer membrane 140 may have a plane size of about 60 mm×60 mm, about 60 mm×90 mm, or about 120 mm×150 mm.

In some exemplary embodiments, the plane size of the carbon-containing thin film 120 may be substantially the same as the plane size of the porous transfer membrane 140. In some exemplary embodiments, the plane size of the carbon-containing thin film 120 may be different from the plane size of the porous transfer membrane 140. For example, the plane size of the porous transfer membrane 140 may be greater than the plane size of the carbon-containing thin film 120.

According to an exemplary embodiment, a plane shape of the opening 150H defined at the central portion of the pellicle frame 150 may not be limited to a square shape or a rectangular shape. In embodiments, and the pellicle frame 150 may have various shapes according to need or according to a shape or a structure of a photomask substrate. For example, the opening 150H defined at the central portion of the pellicle frame 150 may have various plane shapes such as a triangular shape, a quadrangular shape, a hexagonal shape, and an octagonal shape, and the pellicle frame 150 may also have various plane shapes such as a triangular shape, a quadrangular shape, a hexagonal shape, and an octagonal shape so as to correspond to the plane shape of the opening 150H of the pellicle frame 150.

In some exemplary embodiments, the pellicle frame 150 may include metallic material, non-metallic material, or a polymer. For example, the pellicle frame 150 may include, for example, one or more of carbon, diamond like carbon (DLC), aluminium, stainless steel, or polyethylene.

In some exemplary embodiments, the adhesion layer 160 may include, for example, an adhesive such as an acrylic resin, an epoxy resin, or a fluoride resin.

While the carbon-containing thin film 120 is attached to the pellicle frame, a portion of the liquid 132 which fills the inner spaces of the plurality of pores 142 in the porous transfer membrane 140 may be dried, and at least a portion of the inner spaces of the plurality of pores 142 may be in a state of being empty.

In some exemplary embodiments, as described with reference to FIG. 2F, attaching the carbon-containing thin film 120 to the pellicle frame 150 may be manually performed. In some exemplary embodiments, attaching the carbon-containing thin film 120 to the pellicle frame 150 may be automatically performed by using a machine.

In process P18 of FIG. 1, in a state in which the carbon-containing thin film 120 is attached to the pellicle frame 150, the porous transfer membrane 140 may be separated from the carbon-containing thin film 120.

Figure 2G:
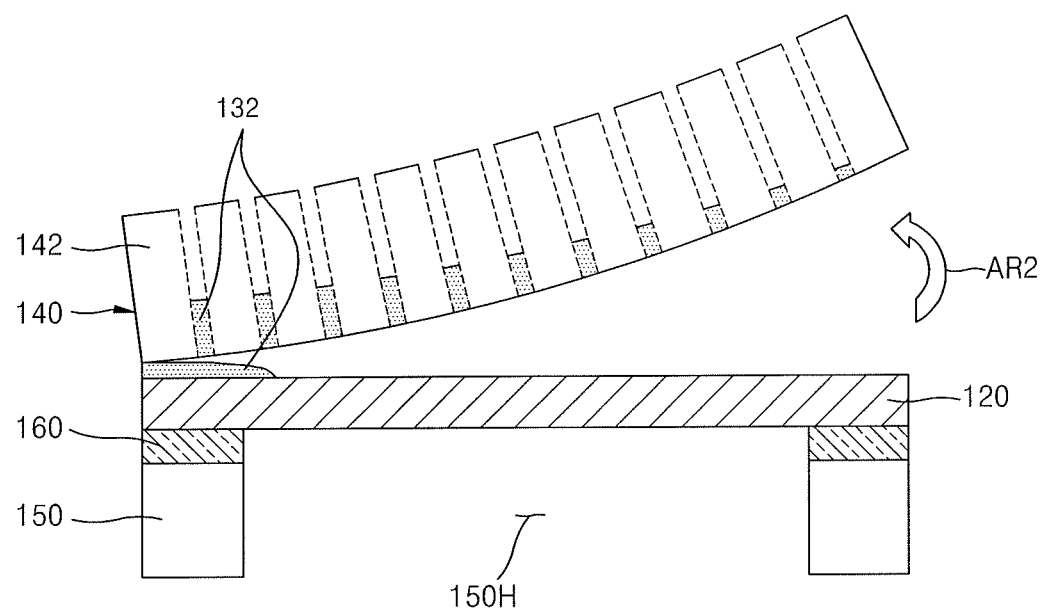
Figure 2H:
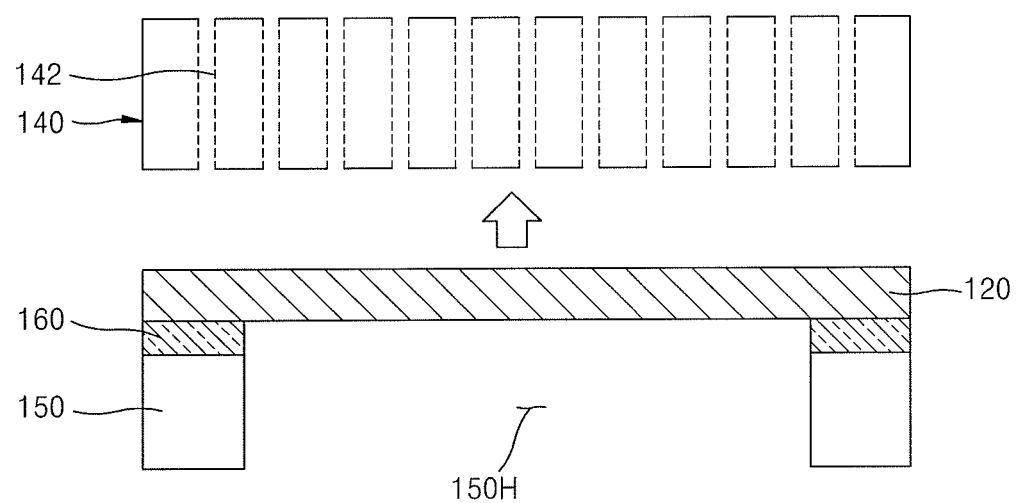

FIGS. 2G and 2H illustrate cross-sectional views of a process of separating the porous transfer membrane 140 from the carbon-containing thin film 120.

Referring to FIG. 2G, the porous transfer membrane 140 may be separated from the carbon-containing thin film 120 in an arrow direction AR2, and as illustrated in FIG. 2H, the porous transfer membrane 140 may be fully separated from the carbon-containing thin film 120.

In some exemplary embodiments, in order to further facilitate the separation of the porous transfer membrane 140, the porous transfer membrane 140 may be separated from the carbon-containing thin film 120 in a state in which a portion of the liquid 132 remains in the inner spaces of the plurality of pores 142 in the porous transfer membrane 140.

The carbon-containing thin film 120 may be attached onto the porous transfer membrane 140 due to, for example, the surface tension and the capillary phenomenon of the liquid 132 having a relatively weak adhesive force, and as illustrated in FIG. 2H, after the porous transfer membrane 140 is fully separated from the carbon-containing thin film 120, undesired residue may not remain and a clean state may be maintained, between the porous transfer membrane 140 and the carbon-containing thin film 120. The liquid 132 filling the space between the porous transfer membrane 140 and the carbon-containing thin film 120 may be removed from the space by flowing out or drying.

In process P20 of FIG. 1, the carbon-containing thin film 120 may be dried.

Figure 2I:
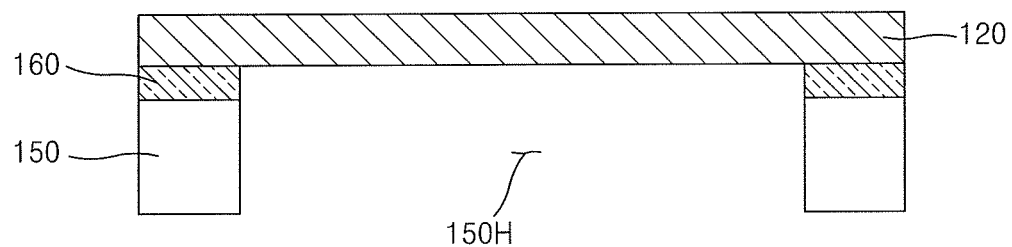

FIG. 2I illustrates a cross-sectional view of a resultant structure in which the carbon-containing thin film 120 is attached to the pellicle frame 150 in a free-standing structure in a state of being dried.

As illustrated in FIG. 2I, the pellicle assembly 100 may be obtained which may have a structure in which the carbon-containing thin film 120 having a relatively large area may be supported by the pellicle frame 150 in the free-standing structure.

In some exemplary embodiments, a clean bench, a hot plate, a vacuum oven, or a nitrogen gun may be used to dry the carbon-containing thin film 120. In some exemplary embodiments, the carbon-containing thin film 120 may be dried in the atmosphere.

In the method of manufacturing the pellicle assembly 100 described with reference to FIGS. 1 to 2I, according to exemplary embodiments the carbon-containing thin film 120 may be used as a pellicle membrane constituting the pellicle assembly 100. In embodiments, the pellicle membrane constituting the pellicle assembly 100 may use a membrane including various materials such as a metal material, a ceramic material, and a polymer.

According to the method of manufacturing the pellicle assembly 100 described with reference to FIGS. 1 to 2I, according to exemplary embodiments, the carbon-containing thin film 120 may be attached to the pellicle frame 150 in the dry atmosphere by using the porous transfer membrane 140. In exemplary embodiments, for example, the porous transfer membrane 140 may be used as a means for transferring the carbon-containing thin film 120 to the pellicle frame 150. In the method of manufacturing the pellicle assembly 100, according to exemplary embodiments, the carbon-containing thin film 120 may be transferred to the pellicle frame 150 by using a transfer membrane that may not include pores. While the carbon-containing thin film 120 is transferred by using the porous transfer membrane 140 or the transfer membrane not including the pores as a means for transferring the carbon-containing thin film 120 to the pellicle frame 150, the carbon-containing thin film 120 may be maintained in a state of being attached to the porous transfer membrane 140 or the transfer membrane not including the pores, by using the surface tension and the capillary phenomenon of the liquid 132. The carbon-containing thin film 120, which may be evenly attached onto the porous transfer membrane 140 or the transfer membrane not including the pores, may be transferred intact to the pellicle frame 150 without a warpage or deflection phenomenon by using the porous transfer membrane 140 or the transfer membrane not including the pores through the simple process described above.

Figure 3:
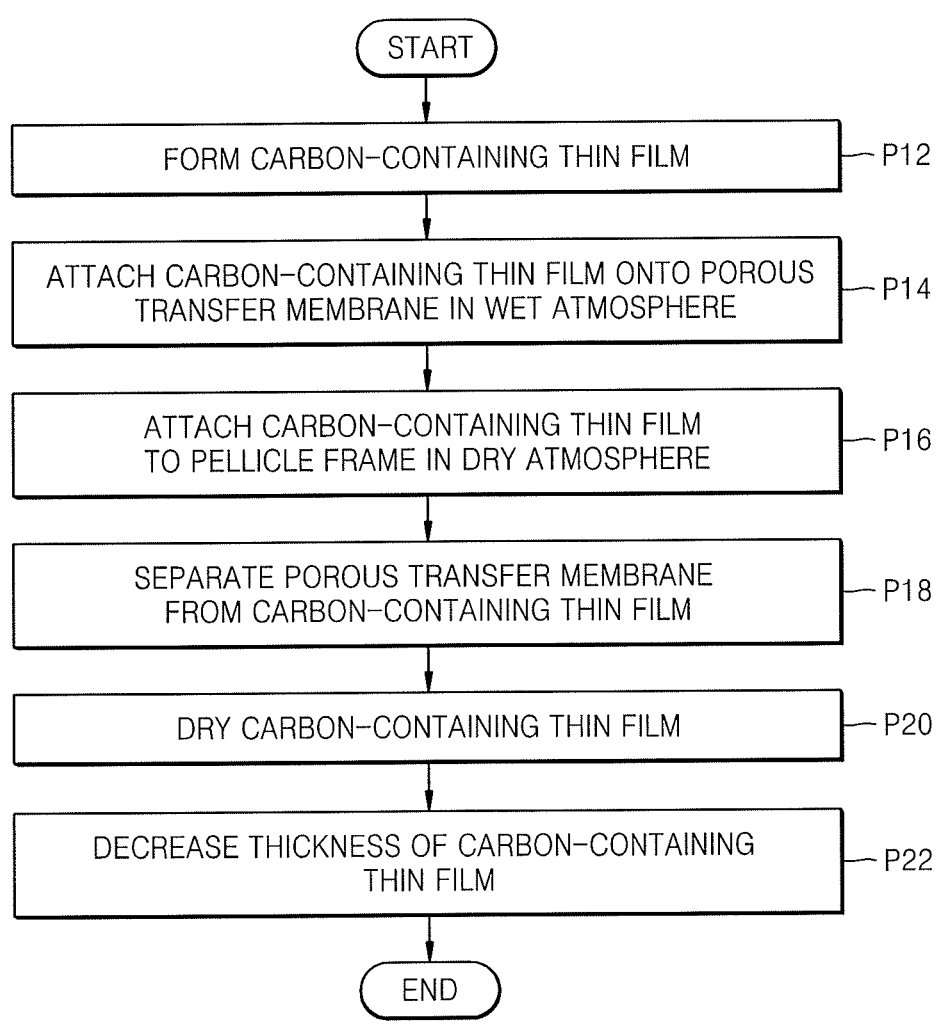
FIG. 3 illustrates a flowchart of a method of manufacturing a pellicle assembly, according to an exemplary embodiment.

FIG. 3 illustrates a flowchart of a method of manufacturing a pellicle assembly 200 (refer to FIG. 4B), according to an exemplary embodiment. The method of manufacturing the pellicle assembly 200 illustrated in FIG. 3 may be substantially similar to the method of manufacturing the pellicle assembly 100 described with reference to FIGS. 1 to 2I. The method of manufacturing the pellicle assembly 200 may further include, after separating a porous transfer membrane 140 from a carbon-containing thin film 120 in process P18 and drying the carbon-containing thin film 120 in process P20, decreasing a thickness of the carbon-containing thin film 120 (process P22).

For example, in the process P22, the thickness of the carbon-containing thin film 120 may be decreased to obtain an optimal exposure effect by forming a thin film that may be thin enough to transmit EUV light or an electron beam, which may have a wavelength of about 6.75 nm to about 13.5 nm.

Figure 4A:
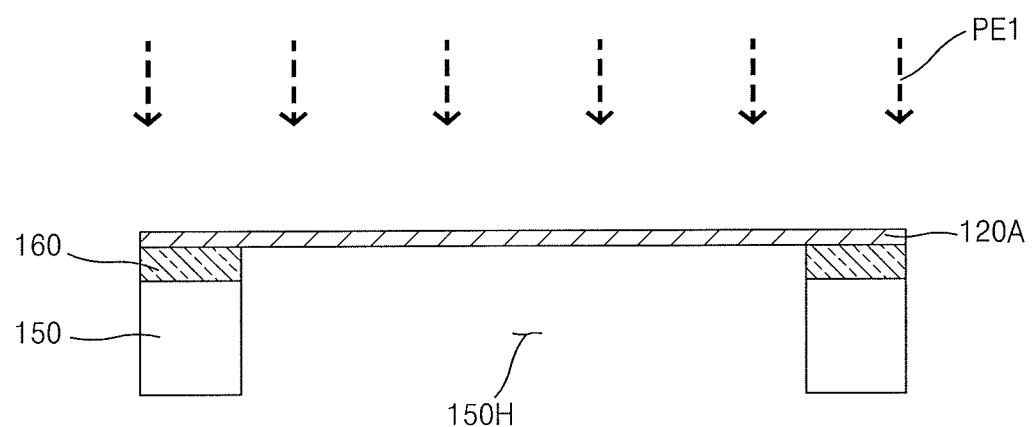
FIGS. 4A and 4B illustrate cross-sectional views of a process of decreasing a carbon-containing thin film, according to an exemplary embodiment.
Figure 4B:
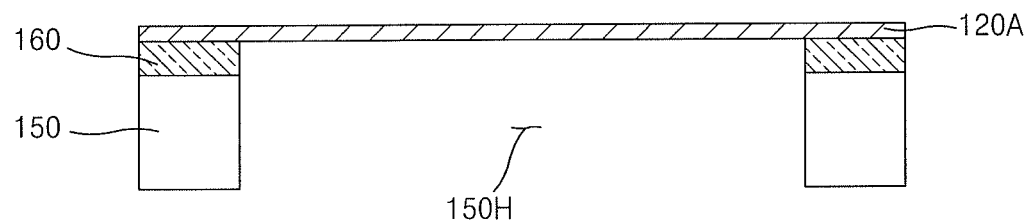

FIGS. 4A and 4B illustrate cross-sectional views of a process of decreasing the thickness of the carbon-containing thin film 120.

Referring to FIG. 4A, the carbon-containing thin film 120 illustrated in FIG. 2I may be removed from an upper surface thereof to a predetermined depth by performing an etching process in a plasma etching atmosphere PE1 that may be performed in an oxygen or hydrogen atmosphere, and a carbon-containing ultra-thin film 120A may be formed.

As illustrated in FIG. 4B, the pellicle assembly 200 may be obtained which includes the carbon-containing ultra-thin film 120A.

In some exemplary embodiments, the carbon-containing ultra-thin film 120A may have a thickness of about 1 nm to about 20 nm.

According to the method of manufacturing the pellicle assembly 200 described with reference to FIGS. 3 to 4B, according to exemplary embodiments, as illustrated in FIG. 2I, the carbon-containing ultra-thin film 120A may be formed by etching the carbon-containing thin film 120 from the upper surface thereof to the predetermined depth to further decrease the thickness thereof, the carbon-containing thin film 120 being evenly maintained on the pellicle frame 150 in a large area free-standing structure, and a pellicle membrane may be realized which may be thin enough to transmit EUV light or an electron beam. The carbon-containing ultra-thin film 120A having a very thin thickness of about 1 nm to about 20 nm may be stably supported on the pellicle frame 150 in the large area free-standing structure.

Figure 5:
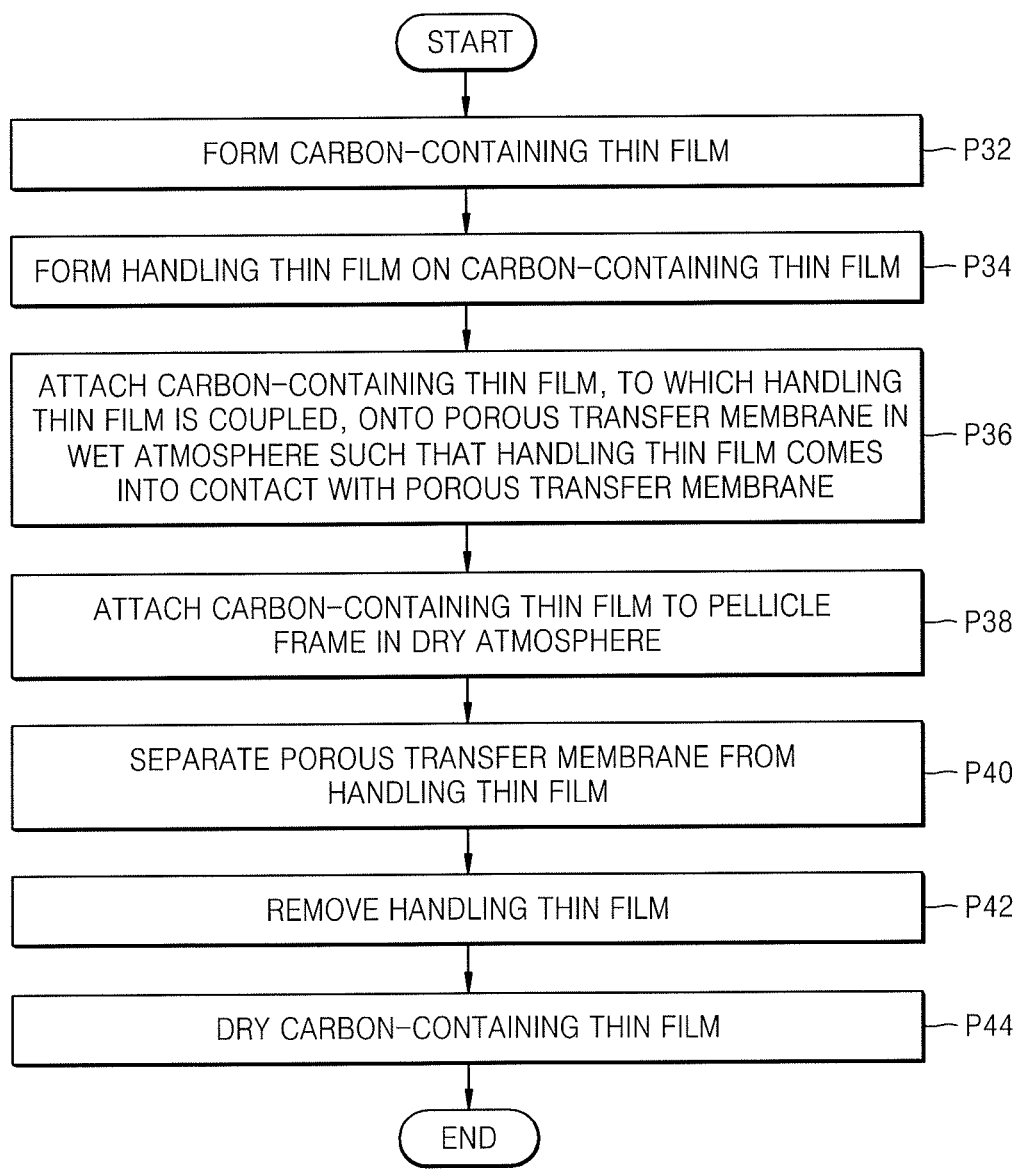
FIG. 5 illustrates a flowchart of a method of manufacturing a pellicle assembly, according to an exemplary embodiment.

FIG. 5 illustrates a flowchart of a method of manufacturing a pellicle assembly 300 (refer to FIG. 6H), according to an exemplary embodiment.

FIGS. 6A to 6H illustrate views of the method of manufacturing the pellicle assembly 300 of FIG. 5.

In process P32 of FIG. 5, a carbon-containing thin film 420 may be formed in a similar manner as the process P12 of FIG. 1 and as described with reference to FIGS. 2A and 2B. In the present exemplary embodiment, the carbon-containing thin film 420 may be formed to have a relatively thin thickness on a support substrate 110.

In some exemplary embodiments, the carbon-containing thin film 420 may be sufficiently thin, for example, having a thickness of about 1 nm to about 20 nm, to transmit EUV light or an electron beam, which may have a wavelength of about 6.75 nm to about 13.5 nm.

Figure 6A:
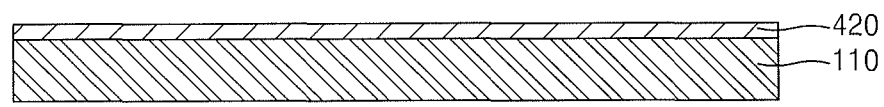
FIGS. 6A to 6H illustrate views of a method of manufacturing a pellicle assembly, according to an exemplary embodiment.

A resultant structure, in which the carbon-containing thin film 420 is formed on the support substrate 110, is illustrated in FIG. 6A.

In some exemplary embodiments, the carbon-containing thin film 420 may include one or more of graphene or graphite.

A description of forming the carbon-containing thin film 420 may be substantially the same as the description of forming the carbon-containing thin film 120 provided with reference to FIGS. 2A and 2B.

In process P34 of FIG. 5, a handling thin film 422 may be formed on the carbon-containing thin film 420.

Figure 6B:
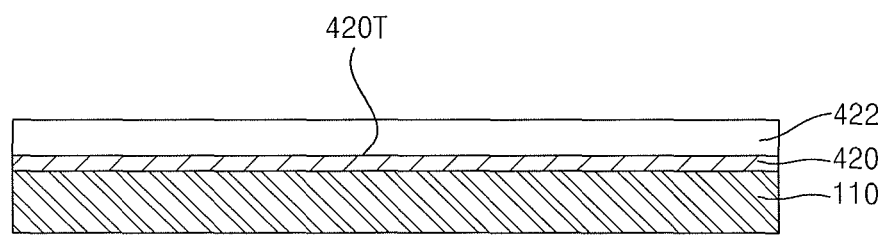

FIG. 6B illustrates a cross-sectional view of a resultant structure in which the handling thin film 422 is formed on the carbon-containing thin film 420.

In some exemplary embodiments, the handling thin film 422 may be formed on an upper surface 420T of the carbon-containing thin film 420.

In some exemplary embodiments, a polymer film may be coated on the upper surface 420T of the carbon-containing thin film 420, and the handling thin film 422 may be formed. The polymer film may include, for example, one or more of poly(methylmethacrylate) (PMMA) or polydimethylsiloxane (PDMS).

In some exemplary embodiments, the handling thin film 422 may include one or more of a metal material or a ceramic material.

Figure 6C:
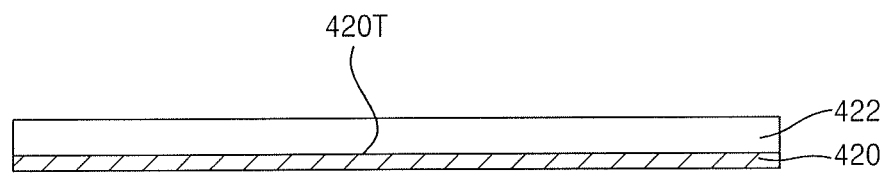

Referring to FIG. 6C, the support substrate 110 (see FIG. 6B) may be removed in a same manner as described with reference to FIG. 2B.

In process P36 of FIG. 5, the carbon-containing thin film 420 may be attached onto a porous transfer membrane 140 in a wet atmosphere. Attaching the carbon-containing thin film 420 onto the porous transfer membrane 140 may be performed in a similar manner as the process P14 of FIG. 1 and as described with reference to FIGS. 2C and 2D.

Figure 6D:
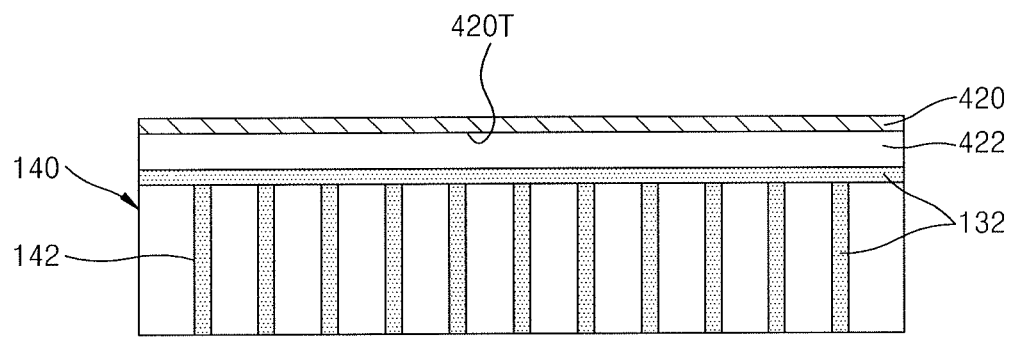

FIG. 6D illustrates a cross-sectional view of a state in which the carbon-containing thin film 420 is attached onto the porous transfer membrane 140.

Referring to FIG. 6D, the carbon-containing thin film 420, to which the handling thin film 422 is coupled, may be attached onto the porous transfer membrane 140 such that the handling thin film 422 comes into contact with the porous transfer membrane 140.

After the carbon-containing thin film 420 is attached onto the porous transfer membrane 140, the porous transfer membrane 140 may face the upper surface 420T of the carbon-containing thin film 420 in-between the handling thin film 422.

In a state in which the carbon-containing thin film 420 is attached onto the porous transfer membrane 140 with the handling thin film 422 interposed between the carbon-containing thin film 420 and the porous transfer membrane 140, a liquid 132 may fill a space between the porous transfer membrane 140 and the handling thin film 422 and may fill at least a portion of inner spaces of a plurality of pores 142. Due to, for example, a surface tension and a capillary phenomenon of the liquid 132, the handling thin film 422 coupled to the carbon-containing thin film 420 may be maintained in a state of being attached onto the porous transfer membrane 140.

As illustrated in FIG. 6D, a resultant structure may be obtained after the carbon-containing thin film 420, to which the handling thin film 422 is coupled, is attached onto the porous transfer membrane 140. The resultant structure may be dried in the atmosphere for several seconds to several ten minutes. The resultant structure may be dried such that the liquid 132 remains between the porous transfer membrane 140 and the handling thin film 422 and remains in at least a portion of the inner spaces of the plurality of pores 142 in the porous transfer membrane 140.

In process P38 of FIG. 5, in a state in which the carbon-containing thin film 420 is attached onto the porous transfer membrane 140, the carbon-containing thin film 420 may be attached to a pellicle frame 150 in a dry atmosphere in a similar manner as the process P16 described with reference with FIG. 1.

Figure 6E:
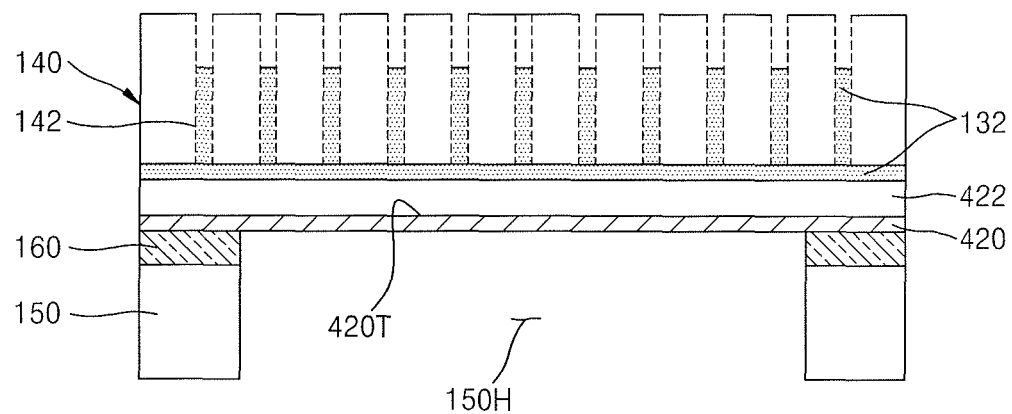

FIG. 6E illustrates a cross-sectional view of a state in which the carbon-containing thin film 420 is attached to the pellicle frame 150 in the dry atmosphere in a state in which the handling thin film 422 is formed on the upper surface 420T of the carbon-containing thin film 420 and is attached to the porous transfer membrane 140.

Referring to FIG. 6E, an adhesion layer 160 may be used to attach the carbon-containing thin film 420 to the pellicle frame 150 in a similar manner as described with reference to FIG. 2F.

While the carbon-containing thin film 420 is attached to the pellicle frame 150, a portion of the liquid 132 may be dried which fills the inner spaces of the plurality of pores 142 in the porous transfer membrane 140, and at least a portion of the inner spaces of the plurality of pores 142 may be in a state of being emptied.

In some exemplary embodiments, as illustrated in FIG. 6E, attaching the carbon-containing thin film 420 to the pellicle frame 150 may be manually performed. In some exemplary embodiments, attaching the carbon-containing thin film 420 to the pellicle frame 150 may be automatically performed by using a machine.

In process P40 of FIG. 5, the porous transfer membrane 140 may be separated from the handling thin film 422 in a similar manner as the process P18 described with reference to FIG. 1.

In the process P40 of FIG. 5, separating the porous transfer membrane 140 from the handling thin film 422 may be performed in a similar manner as described with reference to FIGS. 2G and 2H.

Figure 6F:
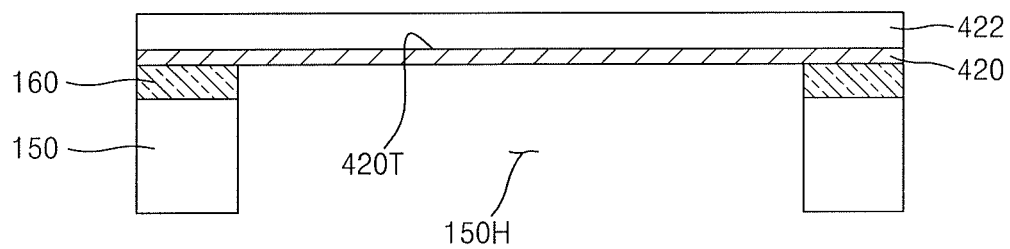

FIG. 6F illustrates a cross-sectional view of a resultant structure in which the porous transfer membrane 140 is separated from the handling thin film 422.

In process P42 of FIG. 5, the handling thin film 422 may be removed.

Figure 6G:
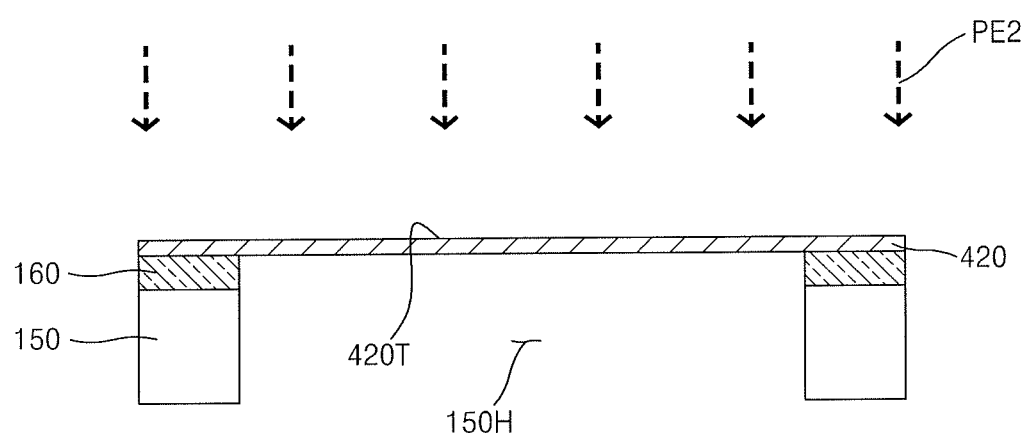

FIG. 6G illustrates a cross-sectional view of a process of removing the handling thin film 422 from the resultant structure of FIG. 6F.

Referring to FIG. 6G, in order to remove the handling thin film 422, an etching process may be performed in a plasma etching atmosphere PE2 that may be performed in an oxygen or hydrogen atmosphere.

In process P44 of FIG. 5, the carbon-containing thin film 420 may be dried in the same manner as the process P20 of FIG. 1.

Figure 6H:
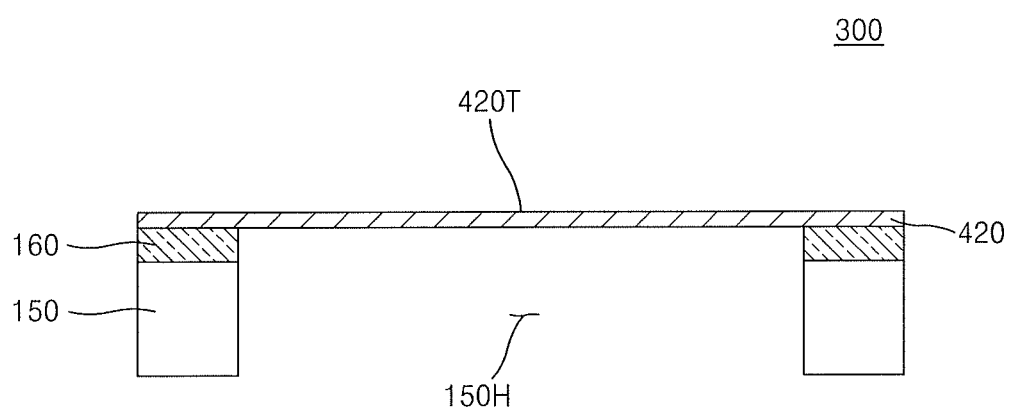

A resultant structure, in which the carbon-containing thin film 420 is dried, is illustrated in FIG. 6H. As illustrated in FIG. 6H, the pellicle assembly 300 may be obtained which may have a structure in which the upper surface 420T of the carbon-containing thin film 420 may be exposed in a direction opposite to the pellicle frame 150.

In some exemplary embodiments, after the upper surface 420T of the carbon-containing thin film 420 is exposed, a thickness of the carbon-containing thin film 420 may be further decreased in a same manner as the description provided with reference to FIG. 4A.

FIG. 7 illustrates a flowchart of a method of manufacturing a pellicle assembly 400 (refer to FIG. 8E), according to an exemplary embodiment.

FIGS. 8A to 8E illustrate views of the method of manufacturing the pellicle assembly 400 illustrated in FIG. 7.

In process P52 of FIG. 7, a carbon-containing thin film 420 may be formed on a support substrate 110 in a similar manner as the process P32 of FIG. 5 and as described with reference to FIG. 6A.

In process P54 of FIG. 7, a handling thin film 422 may be formed on the carbon-containing thin film 420 in a similar manner as the process P34 of FIG. 5 and as described with reference to FIG. 6B.

The support substrate 110 may be removed in the same manner as described with reference to FIG. 6C.

In process P56 of FIG. 7, the carbon-containing thin film 420, to which the handling thin film 422 is coupled, may be attached onto a porous transfer membrane 140 in a wet atmosphere. The carbon-containing thin film 420 may directly come into contact with the porous transfer membrane 140.

Figure 8A:
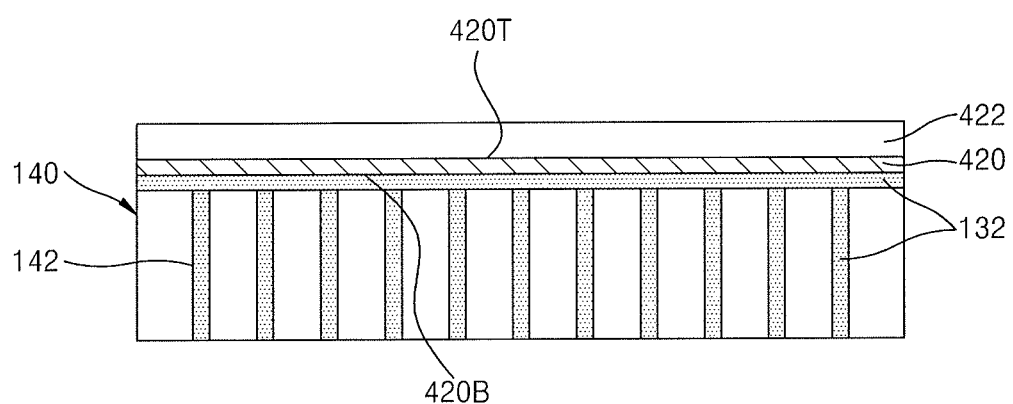
FIGS. 8A to 8E illustrate views of a method of manufacturing a pellicle assembly, according to an exemplary embodiment.

FIG. 8A illustrates a cross-sectional view of a state in which the carbon-containing thin film 420 is attached onto the porous transfer membrane 140.

Referring to FIG. 8A, after the carbon-containing thin film 420 is attached onto the porous transfer membrane 140, the porous transfer membrane 140 may face a lower surface 420B of the carbon-containing thin film 420.

In some exemplary embodiments, an upper surface 420T of the carbon-containing thin film 420 may be maintained in a state of being covered with the handling thin film 422.

In a state in which the carbon-containing thin film 420 is attached onto the porous transfer membrane 140, a liquid 132 may fill a space between the porous transfer membrane 140 and the carbon-containing thin film 420 and may fill at least a portion of inner spaces of a plurality of pores 142. Due to, for example, a surface tension and a capillary phenomenon of the liquid 132 filling the space between the porous transfer membrane 140 and the carbon-containing thin film 420, the carbon-containing thin film 420 may be maintained in a state of being attached onto the porous transfer membrane 140.

A resultant structure, in which the carbon-containing thin film 420 is attached onto the porous transfer membrane 140, may be dried in the atmosphere for several seconds to several ten minutes. The resultant structure may be dried such that liquid 132 remains between the porous transfer membrane 140 and the carbon-containing thin film 420 and remains in at least a portion of the inner spaces of the plurality of pores 142 in the porous transfer membrane 140.

In process P58 of FIG. 7, in a state in which the carbon-containing thin film 420 is attached onto the porous transfer membrane 140, the carbon-containing thin film 420 may be attached to a pellicle frame 150 in a dry atmosphere in a similar manner as the process P16 described with reference with FIG. 1.

Figure 8B:
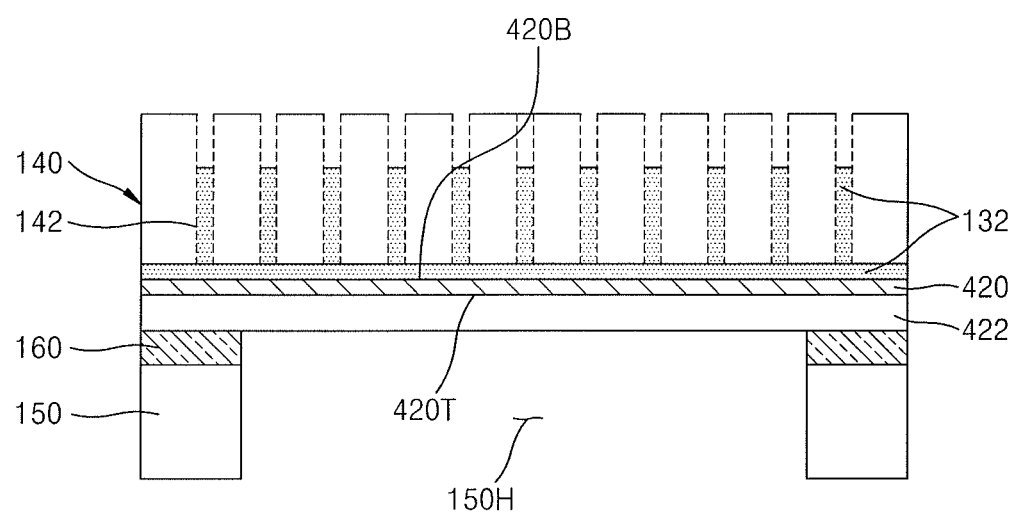

FIG. 8B illustrates a cross-sectional view of a state in which the handling thin film 422 covering the upper surface 420T of the carbon-containing thin film 420 is attached onto the pellicle frame 150 in the dry atmosphere in a state in which the handling thin film 422 is attached onto the upper surface 420T of the carbon-containing thin film 420.

Referring to FIG. 8B, an adhesion layer 160 may be used to attach the handling thin film 422 formed on the carbon-containing thin film 420 to the pellicle frame 150 in a similar manner as described with reference to FIG. 2F.

While the handling thin film 422 formed on the carbon-containing thin film 420 is attached to the pellicle frame 150, a portion of the liquid 132 may be dried which fills the inner spaces of the plurality of pores 142 in the porous transfer membrane 140, and at least a portion of the inner spaces of the plurality of pores 142 may be in a state of being emptied.

In some exemplary embodiments, as illustrated in FIG. 8B, in a state in which the handling thin film 422 is coupled to the carbon-containing thin film 420, attaching the carbon-containing thin film 420 to the pellicle frame 150 may be manually performed. In some exemplary embodiments, attaching the carbon-containing thin film 420 to the pellicle frame 150 may be automatically performed by using a machine.

In process P60 of FIG. 7, the porous transfer membrane 140 may be removed from the carbon-containing thin film 420.

In the process P60 of FIG. 7, separating the porous transfer membrane 140 from the carbon-containing thin film 420 may be performed in a similar manner as described with reference to FIGS. 2G and 2H.

Figure 8C:
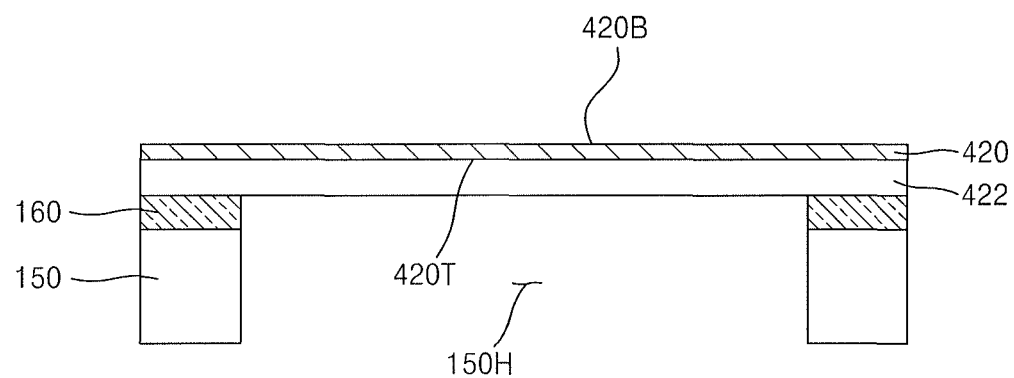

FIG. 8C illustrates a cross-sectional view of a resultant structure in which the porous transfer membrane 140 is separated from the carbon-containing thin film 420.

In process P62 of FIG. 7, the handling thin film 422 may be partially removed.

Figure 8D:
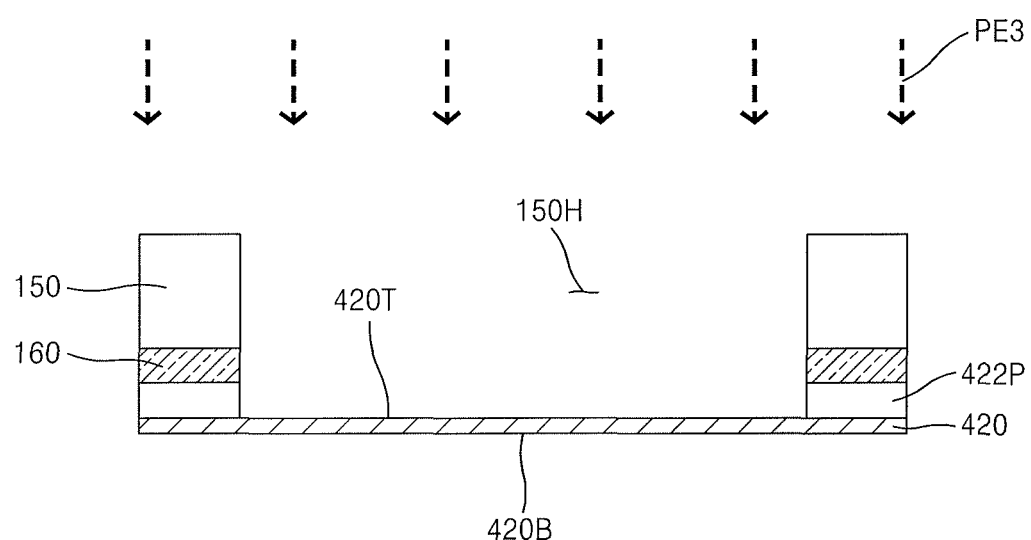

FIG. 8D illustrates a cross-sectional view of a process of removing a portion of the handling thin film 422, which may be exposed through an opening 150H defined at a central portion of the pellicle frame 150.

Referring to FIG. 8D, in order to remove the portion of the handling thin film 422, which may be exposed through the opening 150H defined at the central portion of the pellicle frame 150, an etching process may be performed in a plasma etching atmosphere PE3 that may be performed in an oxygen or hydrogen atmosphere, and only a portion of the handling thin film 422, which is bonded to the adhesion layer 160, may remain as a handling thin film pattern 422P between the pellicle frame 150 and the carbon-containing thin film 420.

In process P64 of FIG. 7, the carbon-containing thin film 420 may be dried in the same manner as the process P20 of FIG. 1.

Figure 8E:
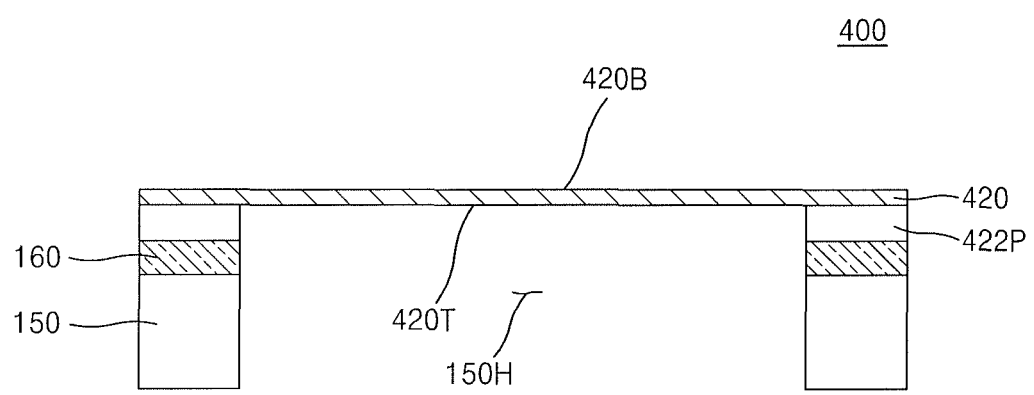

A resultant structure obtained after drying the carbon-containing thin film 420 of a resultant structure of FIG. 8D is illustrated in FIG. 8E. As illustrated in FIG. 8E, the pellicle assembly 400 may be obtained which may have a structure in which the upper surface 420T of the carbon-containing thin film 420 faces the pellicle frame 150, and the lower surface 420B thereof may be exposed in a direction opposite to the pellicle frame 150.

In some exemplary embodiments, after the lower surface 420B of the carbon-containing thin film 420 is exposed, a thickness of the carbon-containing thin film 420 may be further decreased in a same manner as described with reference to FIG. 4A.

According to the method of manufacturing the pellicle assemblies 100, 200, 300, and 400 described with reference to FIGS. 1 to 8E, according to exemplary embodiments, while an exposure process is performed to manufacture an integrated circuit device, at the time of manufacturing a pellicle assembly for protecting a photomask from being contaminated in storing, transferring, and using the photomask, the pellicle assembly may be obtained to which a pellicle film may be evenly attached without an undesired warpage or deflection phenomenon, the pellicle film including a thin film that may be thin enough to transmit EUV light or an electron beam, which may have a wavelength of about 6.75 nm to about 13.5 nm. According to the method of manufacturing the pellicle assembly, according to exemplary embodiments, a pellicle assembly may be formed which may have a structure in which a pellicle membrane may be evenly attached to a pellicle frame as the aforementioned pellicle membrane without an undesired warpage or deflection phenomenon, the pellicle membrane having various thicknesses that may be in a range of about 1 nm to about 200 nm. Therefore, when the exposure process is performed using the pellicle assembly manufactured through the method according to exemplary embodiments, an error may be efficiently prevented from being generated due to, for example, deterioration in flatness characteristic of the pellicle membrane, and a desired pattern may be transferred to an accurate position on a wafer.

Figure 9:
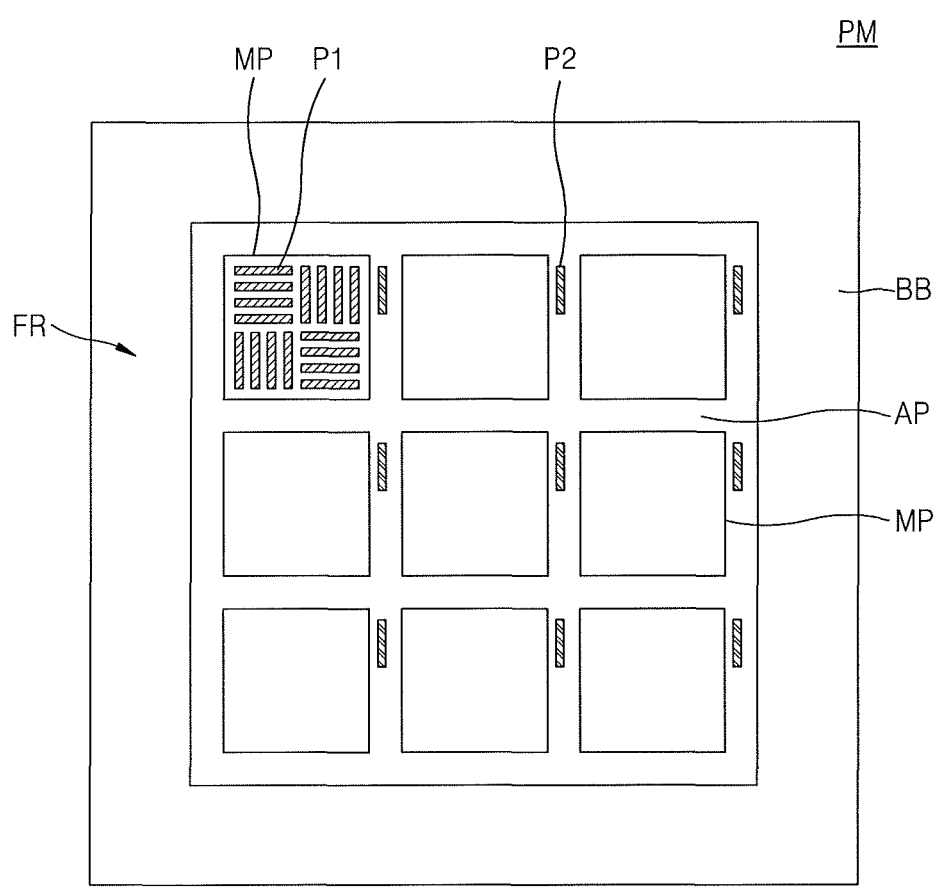
FIG. 9 illustrates a plan view of a structure of a photomask capable of being coupled to a pellicle assembly manufactured through a method according to an exemplary embodiment.

FIG. 9 illustrates a plan view of a structure of a photomask PM capable of being coupled to a pellicle assembly manufactured through a method according to an exemplary embodiment.

The photomask PM illustrated in FIG. 9 may be a reflective photomask used to manufacture an integrated circuit such as a semiconductor device by transferring a pattern onto a wafer through an exposure process. In some exemplary embodiments, the photomask PM may be used in a photolithography process using the wavelength range of EUV light, for example, an exposure wavelength of about 13.5 nm and may be a reflective photomask based on a multi-layered mirror structure.

A surface FR of a front side in the photomask PM may have a main pattern region MP for transferring, on a chip region of the wafer, a main pattern required to form a unit element constituting an integrated circuit, may have an auxiliary pattern region AP for transferring an auxiliary pattern onto a scribe lane region of the wafer, and may have a black border region BB surrounding the main pattern region MP and the auxiliary pattern region AP.

Main pattern elements P1 may be formed in the main pattern region MP, the main pattern elements P1 constituting the main pattern, which may be required to form the integrated circuit and may be transferred onto the chip region of the wafer.

Auxiliary pattern elements P2 may be formed in the auxiliary pattern region AP, the auxiliary pattern elements P2 being used to transfer, on the scribe lane region of the wafer, not a pattern constituting the integrated pattern to be realized, but an auxiliary pattern, for example, an align key pattern, which may be required in manufacturing the integrated circuit but may not remain in a final product of the integrated circuit.

The black border region BB may be a non-pattern region that may not include pattern elements for transferring a pattern onto the wafer.

Figure 10:
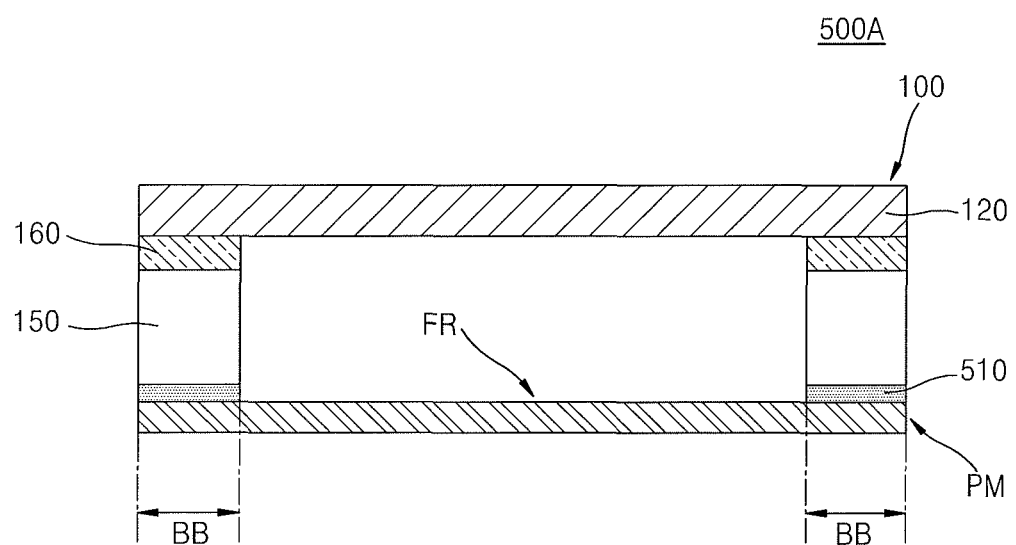
FIG. 10 illustrates a cross-sectional view of a photomask assembly according to an exemplary embodiment.

FIG. 10 illustrates a cross-sectional view of a photomask assembly 500A according to an exemplary embodiment.

Referring to FIG. 10, the photomask assembly 500A may include a photomask PM and a pellicle assembly 100 fixed on a black border region BB above a surface FR of a front side in the photomask PM. The description provided with reference to FIGS. 1 to 2I may be referenced for a more detailed configuration of the pellicle assembly 100.

In order to fix the pellicle assembly 100 on the black border region BB of the photomask PM, an adhesion layer 510 may be disposed between the black border region BB of the photomask PM and a surface of the pellicle frame 150, which is opposed to a surface thereof, to which the carbon-containing thin film 120 may be attached.

In some exemplary embodiments, the adhesion layer 510 may include, for example, one or more of a silicon resin, a fluoride resin, an acrylic resin, or a poly(styrene-ethylene-butadiene-styrene) (SEBS)-based resin.

Figure 11:
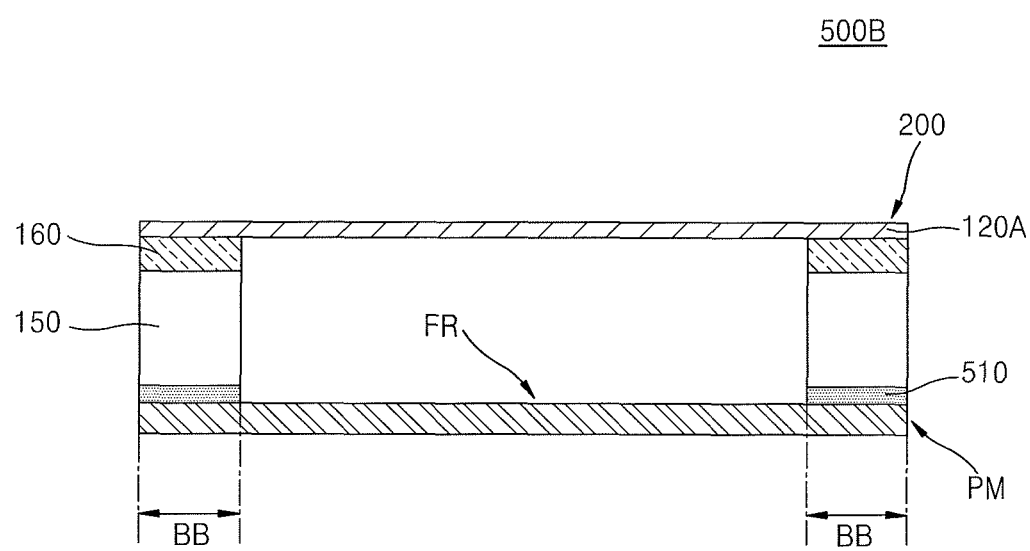
FIG. 11 illustrates a cross-sectional view of a photomask assembly according to an exemplary embodiment.

FIG. 11 illustrates a cross-sectional view of a photomask assembly 500B according to an exemplary embodiment.

Referring to FIG. 11, the photomask assembly 500B may include a photomask PM and a pellicle assembly 200 fixed on a black border region BB above a surface FR of a front side in the photomask PM. The description provided with reference to FIGS. 3 to 4B may be referenced for a more detailed configuration of the pellicle assembly 200.

In order to fix the pellicle assembly 200 on the black border region BB of the photomask PM, an adhesion layer 510 may be disposed between the black border region BB of the photomask PM and a surface of the pellicle frame 150, which is opposed to a surface thereof, to which the carbon-containing ultra-thin film 120A may be attached.

Figure 12:
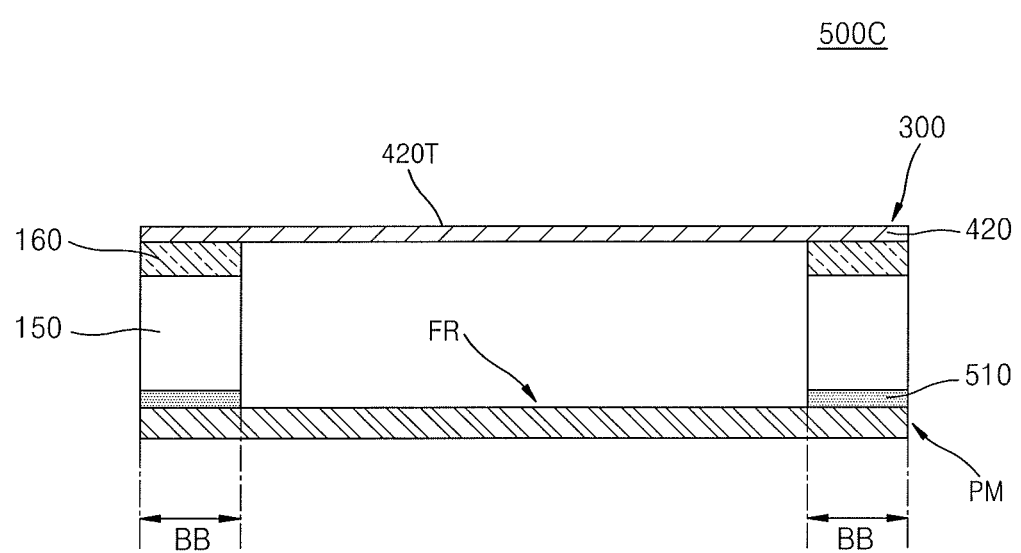
FIG. 12 illustrates a cross-sectional view of a photomask assembly according to an exemplary embodiment.

FIG. 12 illustrates a cross-sectional view of a photomask assembly 500C according to an exemplary embodiment.

Referring to FIG. 12, the photomask assembly 500C may include a photomask PM and a pellicle assembly 300 fixed on a black border region BB above a surface FR of a front side in the photomask PM. The description provided with reference to FIGS. 5 to 6H may be referenced for a more detailed configuration of the pellicle assembly 300.

In order to fix the pellicle assembly 300 on the black border region BB of the photomask PM, an adhesion layer 510 may be disposed between the black border region BB of the photomask PM and a surface of the pellicle frame 150, which is opposed to a surface thereof, to which the carbon-containing thin film 120 may be attached.

Figure 13:
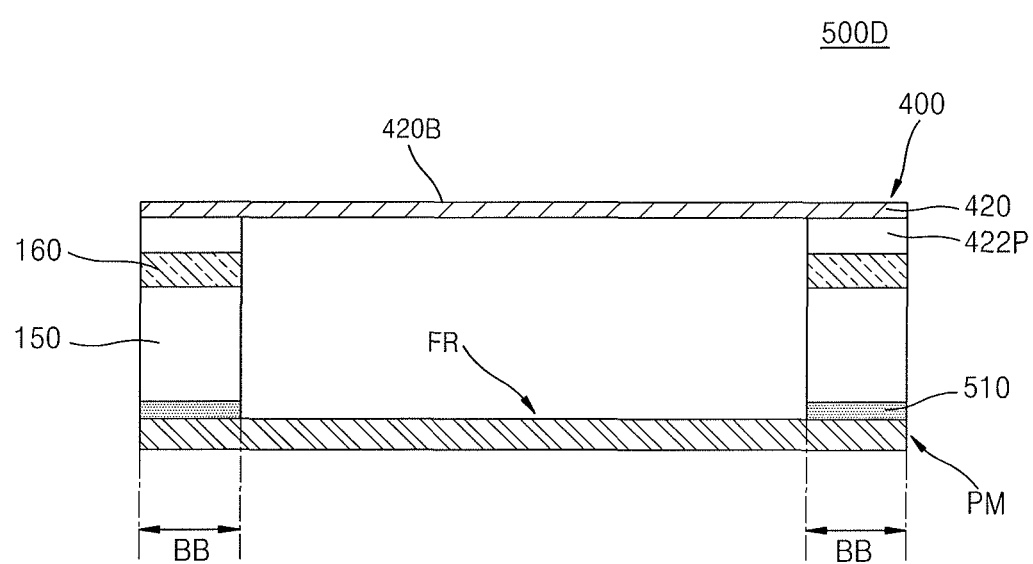
FIG. 13 illustrates a cross-sectional view of a photomask assembly according to an exemplary embodiment.

FIG. 13 illustrates a cross-sectional view of a photomask assembly 500D according to an exemplary embodiment.

Referring to FIG. 13, the photomask assembly 500D may include a photomask PM and a pellicle assembly 400 fixed on a black border region BB above a surface FR of a front side in the photomask PM. The description provided with reference to FIGS. 7 to 8A may be referenced for a more detailed configuration of the pellicle assembly 400.

In order to fix the pellicle assembly 400 on the black border region BB of the photomask PM, an adhesion layer 510 may be disposed between the black border region BB of the photomask PM and a surface of the pellicle frame 150, which is opposed to a surface thereof, to which the carbon-containing thin film 120 may be attached.

The photomask assemblies 500A, 500B, 500C, and 500D illustrated in FIGS. 10 to 13 may include, for example, the reflective photomask PM used in the photolithography process using the exposure wavelength of about 13.5 nm as illustrated in FIG. 9. In embodiments, instead of the reflective photomask PM, a photomask may be used which may be used in an exposure process using, for example, a KrF excimer laser (248 nm), an ArF excimer laser (193 nm), or a fluoride ($F_2$) excimer laser (157 nm).

Figure 14:
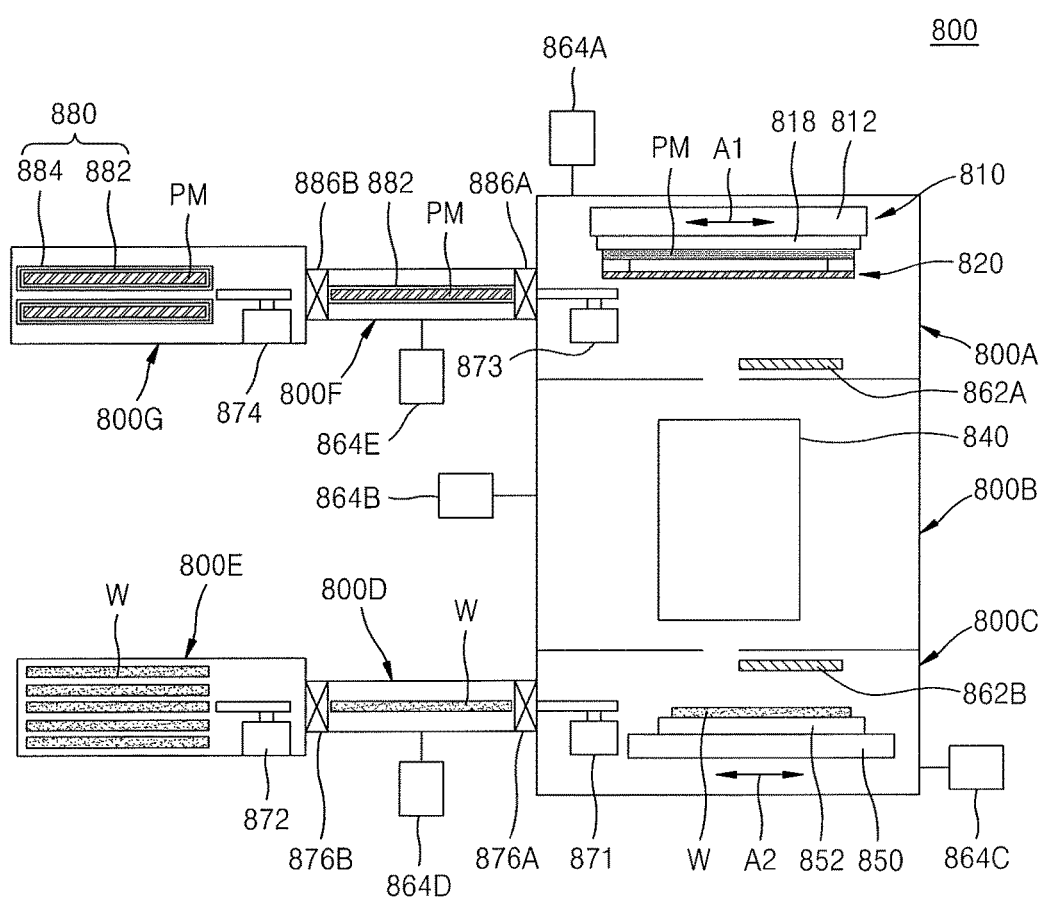
FIG. 14 illustrates a cross-sectional view of an apparatus for manufacturing an integrated circuit device, according to exemplary embodiments.

FIG. 14 illustrates a cross-sectional view of an apparatus 800 for manufacturing an integrated circuit device, according to exemplary embodiments. The apparatus 800 for manufacturing the integrated circuit device is illustrated in FIG. 14. The apparatus 800 may include an exposure device which reduction-transfers an image of a pattern on a wafer in a vacuum atmosphere in a projection optical system, the pattern being patterned on a photomask (or referred to as a reticle) by using EUV light.

Referring to FIG. 14, the apparatus 800 for manufacturing the integrated circuit device may include a mask stage region 800A, a projection optical system region 800B, and a wafer stage region 800C.

A mask stage 810 in the mask stage region 800A may include a mask stage support body 812 and a mask holder system 818 fixed to the mask stage support body 812. The mask holder system 818 may function to fix a photomask PM. In some exemplary embodiments, the mask holder system 818 may include an electrostatic chuck and may adsorb the photomask PM by using an electrostatic force.

A pellicle assembly 820 may be fixed on the photomask PM. The pellicle assembly 820 may include one of the pellicle assemblies 100, 200, 300, and 400 as described with reference to FIGS. 1 to 8E or may include one of modifications of the pellicle assemblies.

The mask stage 810 may move the photomask PM fixedly supported by the mask stage support body 812 in a scan direction such as an arrow direction A1.

A projection optical system 840 may be disposed in the projection optical system region 800B to transfer a pattern formed on the photomask pattern PM on a wafer W in the wafer stage region 800C. The wafer W may be maintained in a state of being fixed on a wafer chuck 852 on a wafer stage 850. The wafer chuck 852 may move the wafer W in a scan direction such as an arrow direction A2.

The mask stage region 800A accommodating the mask stage 810, the projection optical system region 800B accommodating the projection optical system 840, and the wafer stage region 800C accommodating the wafer stage 850 may be separated from one another by gate valves 862A and 862B. Vacuum exhaust devices 864A, 864B, and 864C may be respectively connected to the mask stage region 800A, the projection optical system region 800B, and the wafer stage region 800C, so that a pressure may be independently controlled.

A transfer hand 871 may be installed to carry the wafer W in or out between the wafer stage region 800C and a load lock chamber 800D. A vacuum exhaust device 864D may be connected to the load lock chamber 800D. The wafer W may be temporarily stored in a wafer load port 800E in the atmosphere. A transfer hand 872 may be installed to carry the wafer W in or out between the load lock chamber 800D and the wafer load port 800E. A gate valve 876A may be disposed between the wafer stage region 800C and the load lock chamber 800D. A gate valve 876B may be disposed between the load lock chamber 800D and the wafer load port 800E.

A transfer hand 873 may be installed to carry the wafer W in or out between the mask stage 810 of the mask stage region 800A and a mask load lock chamber 800F. A vacuum exhaust device 864E may be connected to the mask load lock chamber 800F. The photomask PM may be temporarily stored in a mask load port 800G in the atmosphere. A transfer hand 874 may be installed to carry the photomask PM in or out between the mask load lock chamber 800F and the mask load port 800E. A gate valve 886A may be disposed between the mask stage region 800A and the mask load lock chamber 800F. A gate valve 886B may be disposed between the mask load lock chamber 800F and the mask load port 800G.

The photomask PM may be stored and transferred in a state of being accommodated in a photomask carrier 880 until the photomask PM is transferred from the outside to the apparatus 800 for manufacturing the integrated circuit device and may be transferred to the mask load port 800G in a state of being accommodated in the photomask carrier 880. Accordingly, the photomask PM may be efficiently prevented from unnecessarily contacting the outside environment and may be efficiently protected from contamination due to, for example, outside particles.

The photomask carrier 880 may include an inner pod 882 and an outer pod 884 providing a space that accommodates the inner pod 882. Each of the inner pod 882 and the outer pod 884 may include a standard mechanical interface (SMIF) that is compliant with SEMI standard E152-0709. The outer pod 884 may be referred to as a "reticle SMIF pod" and may function to protect the photomask PM when the photomask PM is transferred between different stations or between different positions. The inner pod 882 may function to protect the photomask PM until the photomask PM is placed in a vacuum atmosphere or transferred to the mask stage 810 and the vicinity of the mask stage 810. When a surrounding environment is changed from an atmosphere state to a vacuum state, or from the vacuum state to the atmosphere state, a vortex of contamination particles may be caused, and the photomask PM may be contaminated with the contamination particles floating around the photomask PM The inner pod 882 may function to protect the photomask PM from the aforementioned environment until the photomask PM is placed in the vacuum atmosphere or transferred to the mask stage 810 and the vicinity of the mask stage 810.

In an exposure process of a process of manufacturing a semiconductor device, a latent pattern may be formed by projecting and exposing a pattern formed on a photomask (reticle), on a wafer on which a resist film is formed, and a resist pattern may be formed on the wafer through a developing process. However, when foreign materials, for example, particles, exist on the photomask, the foreign materials may be transferred onto the wafer together with the pattern, and defects of the pattern may be caused.

In a process of manufacturing a semiconductor device, such as an LSI or a VLSI, including an ultra-fine pattern, a reduction projection exposure device may be used which reduction-projects a pattern formed on a photomask, on a resist film formed on a wafer and forms a latent pattern on the resist film. As a packaging density of the semiconductor device increases, a miniaturization of a pattern may be required, and a demand for miniaturizing an exposure line width may increase. Accordingly, in order to improve the resolution performance of the exposure device, a method may shorten an exposure wavelength. An exposure technology may use an i-line (365 nm), a KrF excimer laser (248 nm), an ArF excimer laser (193 nm), and a fluoride ($F_2$) excimer laser (157 nm), and an exposure device may use EUV light or an electron beam, which may have a wavelength of about 6.75 nm or about 13.5 nm of a soft X-ray region. When a wavelength of exposure light is shortened to a level of the EUV light or the electron beam, air may not transmit light in the atmosphere, and it may be necessary to place an optical path of the exposure light in a high vacuum environment. Therefore, it may be necessary to dispose an optical system, a mask stage, and a wafer stage in a vacuum chamber having a sealing characteristic higher than a sealing characteristic of an $F_2$ exposure device, and install a load lock chamber in an entrance of each of a wafer and a photomask to carry the wafer and the photomask in or out in a state in which a vacuum is maintained.

In an EUV exposure, a reflective photomask may be used as the photomask, the reflective photomask including a multi-reflective film on a surface of a front layer on which a pattern region is formed. When the wavelength of the exposure light is shortened to an EUV region, due to, for example, a limitation in selecting a transparent material in EUV light, an exposure process may be performed without using a pellicle, or a pellicle assembly may include a material such as silicon (Si), ruthenium (Ru), or zirconium (Zr), which may be relatively severely deteriorated due to, for example, heat at the time of exposing, and may be low in tensile strength. However, when the pellicle assembly is used, since a free-standing may be difficult to form due to, for example, the low tensile strength, and the pellicle assembly may be vulnerable to damage due to, for example, heat, there may be a limitation in that the photomask may not be protected from particle contamination that may occur at the time of the exposure process.

In the apparatus 800 for manufacturing the integrated circuit device, according to exemplary embodiments, even in the exposure process using EUV light source, the photomask PM may be protected by using the pellicle assembly manufactured through the method according to an embodiment. When the pellicle assembly manufactured through the method according to an embodiment has a large area free-standing structure, an error may be efficiently prevented from being generated due to, for example, deterioration in flatness characteristic of the pellicle membrane, by preventing an undesired warpage or deflection phenomenon from being generated in the pellicle membrane, and a desired pattern may be transferred to an accurate position on a wafer.

Figure 15:
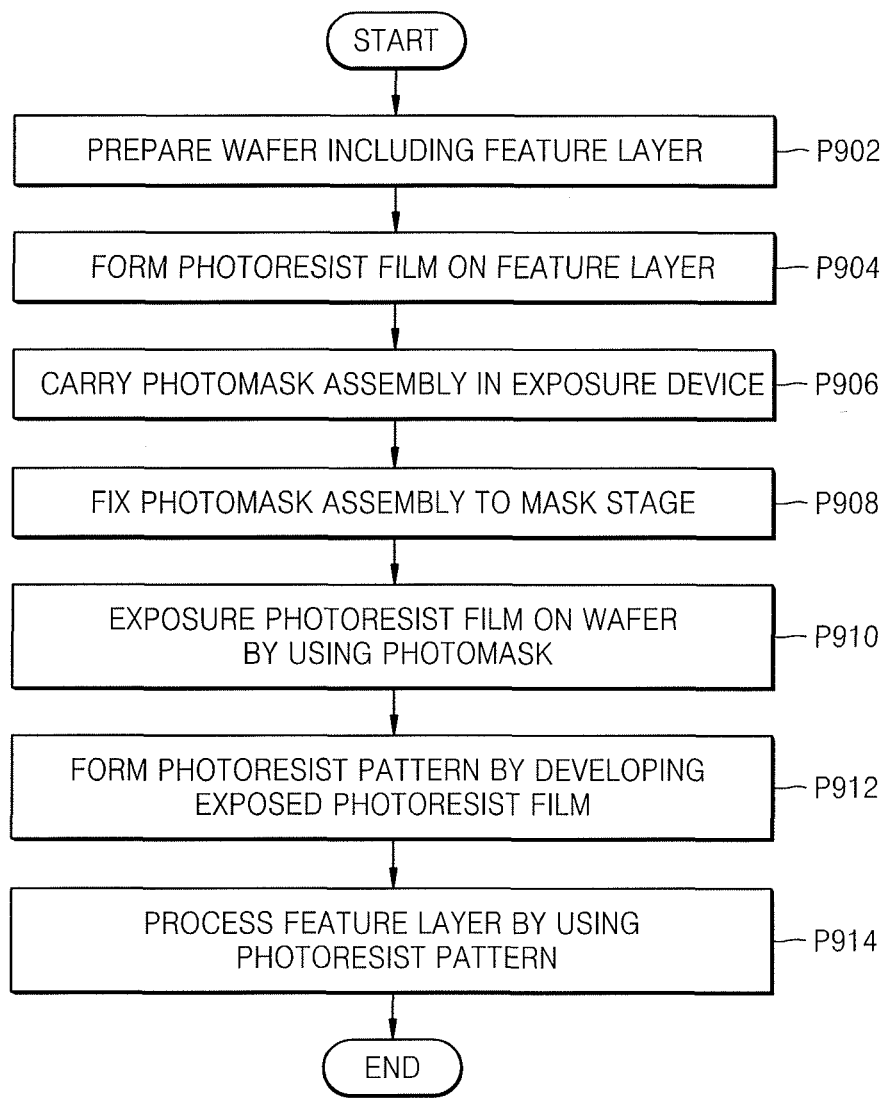
FIG. 15 illustrates a flowchart of a method of manufacturing an integrated circuit device, according to exemplary embodiments.

FIG. 15 illustrates a flowchart of a method of manufacturing an integrated circuit device, according to exemplary embodiments.

Referring to FIG. 15, in process P902, a wafer is prepared which includes a feature layer.

In some exemplary embodiments, the feature layer may be a conductive layer or an insulating layer formed on the wafer. For example, the feature layer may include one or more of a metal, a semiconductor, or an insulating material. In some exemplary embodiments, the feature layer may be a portion of the wafer.

In process P904, a photoresist film may be formed on the feature layer. In some exemplary embodiments, the photoresist film may include a resist material for EUV light (6.75 nm or 13.5 nm). In some exemplary embodiments, the photoresist film may include a resist for an $F_2$ excimer laser (157 nm), a resist for an ArF excimer laser (193 nm), or a resist for a KrF excimer laser (248 nm). The photoresist film may include a positive photoresist or a negative photoresist.

In some exemplary embodiments, in order to form the photoresist film including the positive photoresist, a photosensitive polymer having an acid-labile group and a photoresist composite including a potential acid and a solvent may be spin-coated on the feature layer.

In some exemplary embodiments, the photosensitive polymer may include a (meth)acrylate-based polymer. The photosensitive polymer may include an aliphatic (meth) acrylate-based polymer. For example, the photosensitive polymer may include polymethylmethacrylate (PMMA), poly(t-butylmethacrylate), poly(methacrylic acid), poly(norbornylmethacrylate), a binary or ternary copolymer of repeating units of the (meth)acrylate-based polymers, or mixtures thereof. The aforementioned photosensitive polymers may be substituted with various acid-liable protecting groups. The acid-liable protecting group may include, for example, one or more of a tertbutoxycarbonyl (t-BOC) group, a tetrahydropyranyl group, a trimethylsilyl group, a phenoxyethyl group, a cyclohexenyl group, a tert-butoxycarbonylmethyl group, a tert-butyl group, an adamantly group, or a norbornyl group.

In some exemplary embodiments, the potential acid may include of a photoacid generator (PAG), a thermoacid generator (TAG), or a combination thereof. In some exemplary embodiments, the PAG may include a material that generates an acid when exposed to any one of EUV light (1 nm to 31 nm), an $F_2$ excimer laser (157 nm), an ArF excimer laser (193 nm), and a KrF excimer laser (248 nm). The PAG may include one or more of onium salts, halogen compounds, nitrobenzyl esters, alkylsulfonates, diazonaphthoquinones, iminosulfonates, disulfones, diazomethanes, or sulfonyloxyketones.

In process P906 of FIG. 15, a photomask assembly according to an exemplary embodiment is carried in an exposure device.

In some exemplary embodiments, the photomask assembly may be any one of the photomask assemblies 500A, 500B, 500C, and 500D described with reference to FIGS. 10 to 13, and modifications of the photomask assemblies 500A, 500B, 500C, and 500D.

In some exemplary embodiments, the photomask assembly may be carried in up to the mask load port 800G of the apparatus 800 for manufacturing the integrated circuit device illustrated in FIG. 14.

In process P908 of FIG. 15, the photomask assembly may be fixed to a mask stage.

In some exemplary embodiments, the mask stage may be the mask stage 810 of the apparatus 800 for manufacturing the integrated circuit device illustrated in FIG. 14.

In process P910, a photoresist film on the wafer may be exposed by using the photomask.

In some exemplary embodiments, the exposure process may be performed, for example, in a reflective exposure system. In embodiments, the exposure process may use a transmissive exposure system.

In process P912, a photoresist pattern may be formed by developing the exposed photoresist film.

In process P914, the feature layer may be processed by using the photoresist pattern.

In some exemplary embodiments, in order to process the feature layer according to the process P914, the feature layer may be etched by using the photoresist pattern as an etching mask to form a fine feature pattern.

In some exemplary embodiments, in order to process the feature layer according to the process P914, impurity ions may be implanted into the feature layer by using the photoresist pattern as an ion implantation mask.

In some exemplary embodiments, in order to process the feature layer according to the process P914, a process film may be separately formed on the feature layer exposed through the photoresist pattern formed in the process P912. The process film may include a conductive film, an insulating film, a semiconductor film, or combinations thereof.

Figure 16:
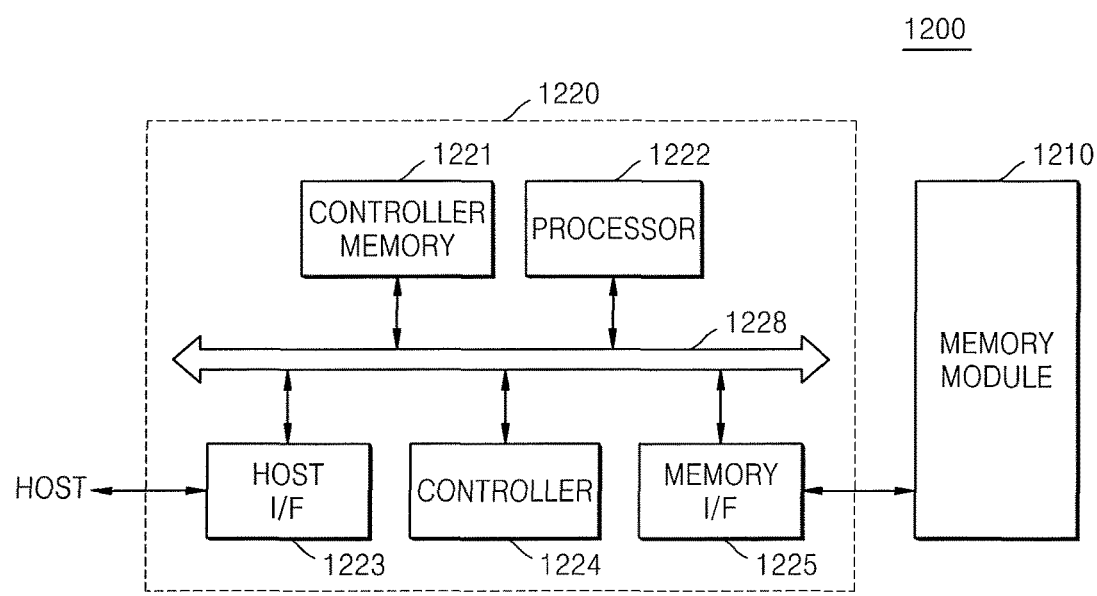
FIG. 16 illustrates a block diagram of a memory card including an integrated circuit device manufactured by using an apparatus for manufacturing an integrated circuit device, according to exemplary embodiments.

FIG. 16 illustrates a block diagram of a memory card 1200 including an integrated circuit device manufactured by using an apparatus for manufacturing an integrated circuit device, according to exemplary embodiments.

The memory card 1200 may include a memory controller 1220 generating command and address signals (C/A) and a memory module 1210, for example, a flash memory including one or more flash memory devices. The memory controller 1220 may include a host interface 1223 transmitting or receiving the command and address signals to or from a host and a memory interface 1225 re-transmitting or receiving the command and address signals to or from the memory module 1210. The host interface 1223, a controller 1224, and the memory interface 1225 may communicate with a controller memory 1221 such as an SRAM and a processor 1222 such as a CPU through a common bus 1228.

The memory module 1210 may receive the command and address signals from the memory controller 1220, and may store data in at least one of memory devices on the memory module 1210, and may search for the data from the at least one of the memory devices. Each of the memory devices may include a plurality of addressable memory cells and a decoder that may receive the command and address signals and may generate a row signal and a column signal so as to access at least one of the addressable memory cells at the time of a programming operation and a reading operation.

Components of the memory card 1200 including the memory controller 1220, the electronic devices 1221, 1222, 1223, 1224, and 1225 included in the memory controller 1220, and the memory module 1210 may include the integrated circuit device manufactured by the apparatus for manufacturing the integrated circuit including the pellicle assembly or the photomask assembly manufactured according to exemplary embodiments. The components of the memory card 1200 including the memory controller 1220, the electronic devices 1221, 1222, 1223, 1224, and 1225 included in the memory controller 1220, and the memory module 1210 may include the integrated circuit device manufactured through the method of manufacturing the integrated circuit device described with reference to FIG. 15.

Figure 17:
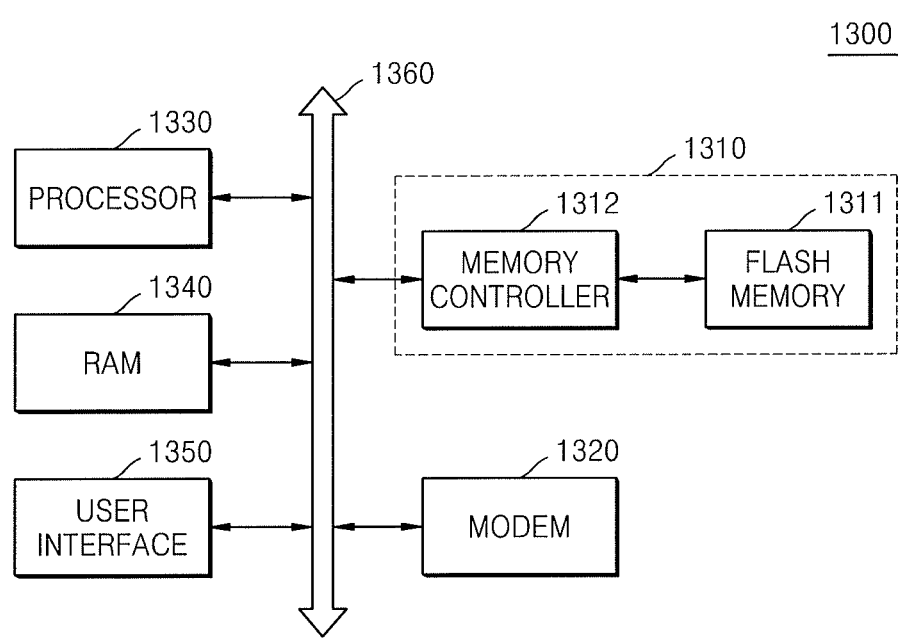
FIG. 17 illustrates a block diagram of a memory system including a memory card that includes an integrated circuit device manufactured using a method of manufacturing an integrated circuit device, according to exemplary embodiments.

FIG. 17 illustrates a block diagram of a memory system 1300 including a memory card 1310 that includes the integrated circuit device manufactured through the method of manufacturing the integrated circuit device, according to exemplary embodiments.

The memory system 1300 may include a processor 1330 such as a CPU a random access memory (RAM) 1340, a user interface 1350, and a modem 1320, which performs a communication through a common bus 1360. Each of the electronic devices 1330, 1340, 1350, and 1320 may transmit or receive a signal to or from the memory card 1310 through the common bus 1360. Each of components of the memory system 1300 including the memory card 1310, the processor 1330, the RAM 1340, the user interface 1350, and the modem 1320 may include the integrated circuit device manufactured by the apparatus for manufacturing the integrated circuit including the pellicle assembly or the photomask, according to exemplary embodiments. The memory system 1300 may include the integrated circuit device manufactured through the method of manufacturing the integrated circuit device described with reference to FIG. 15.

The memory system 1300 may be applied to various electronic application fields. For example, the memory system 1300 may be applied to solid state drivers (SSDs), CMOS image sensors (CISs), and computer application chip set fields.

The disclosed memory systems and devices disclosed may be packaged in any one of various device package shapes including, for example, ball grid arrays (BGAs), chip scale packages (CSPs), plastic leaded chip carriers (PLCCs), plastic dual in-line packages (PDIPs), multi-chip packages (MCPs), wafer-level fabricated packages (WFPs), and wafer-level processed stock packages (WSPs).

By way of summation and review, transferring a single-layered graphene and graphite onto a flat substrate without any wrinkles may be important for applying a single-layered graphene and graphite to various fields, the single-layered graphene being grown on a catalyst metal and the graphite having a thickness of several tens of nanometers. A free-standing size of single-layered graphene may be restricted to a micro size.

To apply a multi-layered graphene to a new field such as a pellicle, the multi-layered graphene may be transferred in a multi-layered free-standing structure. In the case of multi-layered graphene, a 30 nm-scaled graphite may be transferred in a 7 mm-scaled free-standing structure. It may be desirable to transfer multi-layered graphene in a large area free-standing structure so as to apply the multi-layered graphene to a new field such as a microelectromechanical-system (MEMS), a sensor, a speaker, or a pellicle.

Embodiments relate to transferring multi-layered graphene (hereinafter, referred to as MLG) in a free-standing structure in a dry atmosphere by using a membrane so as to prevent deflection of the MLG, which may occur due to, for example, a surface energy difference between the MLG and a liquid in a wet type transferring method. Embodiments relate to separating MLG from a liquid by using a membrane, directly attaching the MLG evenly transferred on the membrane to a frame having an adhesive force, and separating the membrane to form a large area free-standing structure having a several centimeters scale.

After a support polymer (e.g., PMMA) is coated on grown MLG (or single-layered graphene), a catalyst metal may be removed by using a metal etchant. The remaining catalyst metal and metal etchant may be removed by using water and a hydrochloric acid diluted to a concentration of 10%, or a washing process may be performed. Finally, the MLG may be obtained in a state of floating on water. The MLG may be transferred onto a polycarbonate track etch (PCTE) membrane having a pore size of 200 nm, which may be supported by thin plastic. In the state that water is half removed, the MLG/PCTE membrane may be attached onto a frame on which an adhesive may be applied. After the MLG/PCTE membrane is fully attached onto the frame, the PCTE membrane may be removed from the MLG.

In order to improve productivity at the time of manufacturing an integrated circuit device, provided is a system that may be capable of preventing the photomask used in a lithography process from being contaminated with the foreign materials or being deformed by the surrounding environment.

Embodiments provide a method of manufacturing a pellicle assembly, which may be capable of evenly coupling a pellicle film onto a large area pellicle frame in a free-standing structure, the pellicle film including a thin film that may be thin enough to allow EUV light or an electron beam to penetrate therethrough, and the pellicle frame protecting a photomask from contamination in storing, transferring, and using the photomask, having a strong heat resistance, and being applied to a photomask having a relatively large size.

Embodiments provide a method of manufacturing a photomask assembly including a pellicle assembly in which a pellicle film may be coupled onto a pellicle frame in a free-standing structure, the pellicle film including a thin film that may be thin enough to allow EUV light or an electron beam to penetrate therethrough.

Embodiments relate to a method of manufacturing a pellicle assembly that may be used in an exposure device for manufacturing an integrated circuit device and a method of manufacturing a photomask assembly including the pellicle assembly.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a pellicle assembly, the method comprising:
    temporarily attaching a carbon-containing thin film onto a transfer membrane using a liquid in a wet atmosphere, wherein attaching the carbon-containing thin film onto the transfer membrane in the wet atmosphere includes dipping the carbon-containing thin film in the liquid, and attaching the carbon-containing thin film onto the transfer membrane while at least a portion of the carbon-containing thin film is dipped in the liquid;
    attaching the carbon-containing thin film to a pellicle frame in a dry atmosphere while the carbon-containing thin film is attached onto the transfer membrane; and
    separating the transfer membrane from the carbon-containing thin film while the carbon-containing thin film is attached to the pellicle frame.

2. The method as claimed in claim 1, further comprising, after separating the transfer membrane from the carbon-containing thin film, drying the carbon-containing thin film.

3. The method as claimed in claim 1, further comprising, before attaching the carbon-containing thin film onto the transfer membrane or after separating the transfer membrane from the carbon-containing thin film, decreasing a thickness of the carbon-containing thin film.

4. The method as claimed in claim 3, wherein decreasing the thickness of the carbon-containing thin film is performed using a plasma etching process performed in an oxygen or hydrogen atmosphere.

5. The method as claimed in claim 1, wherein attaching the carbon-containing thin film onto the transfer membrane includes attaching the carbon-containing thin film onto the transfer membrane using a surface tension and a capillary phenomenon of the liquid.

6. The method as claimed in claim 1, wherein:
the transfer membrane includes a plurality of pores penetrating the transfer membrane, and
each of the plurality of pores has an average pore size of about 10 nm to about 20 and wherein
at least one of the plurality of pores is filled with the liquid.

7. The method as claimed in claim 1, wherein the transfer membrane includes a transparent film or a translucent film.

8. The method as claimed in claim 1, wherein the transfer membrane includes a porous polymer film.

9. A method of manufacturing a pellicle assembly, the method comprising:
forming a handling thin film on a first surface of a carbon-containing thin film;
temporarily attaching the carbon-containing thin film onto a transfer membrane using a liquid in a wet atmosphere, while maintaining the handling thin film on the carbon-containing thin film,
wherein attaching the carbon-containing thin film onto the transfer membrane in the wet atmosphere includes dipping the carbon-containing thin film in the liquid, and attaching the carbon-containing thin film onto the transfer membrane while at least a portion of the carbon-containing thin film is dipped in the liquid;
attaching the carbon-containing thin film to a pellicle frame in a dry atmosphere while the carbon-containing thin film is attached onto the transfer membrane;
separating the transfer membrane from the carbon-containing thin film while the carbon-containing thin film is attached to the pellicle frame; and
removing at least a portion of the handling thin film.

10. The method as claimed in claim 9, wherein forming the handling thin film includes coating a polymer film on the first surface of the carbon-containing thin film.

11. The method as claimed in claim 9, wherein attaching the carbon-containing thin film onto the transfer membrane includes attaching the carbon-containing thin film onto the transfer membrane such that the transfer membrane faces the first surface of the carbon-containing thin film with the handling thin film between the transfer membrane and the first surface of the carbon-containing thin film.

12. The method as claimed in claim 9, wherein attaching the carbon-containing thin film onto the transfer membrane includes attaching the carbon-containing thin film onto the transfer membrane such that the transfer membrane faces a second surface of the carbon-containing thin film, the second surface of the carbon-containing thin film being opposite to the first surface of the carbon-containing thin film.

13. The method as claimed in claim 9, wherein attaching the carbon-containing thin film onto the transfer membrane is performed using a surface tension and a capillary phenomenon of the liquid.

14. The method as claimed in claim 9, wherein removing at least the portion of the handling thin film is performed using a plasma etching process performed in an oxygen or hydrogen atmosphere.

15. A method of manufacturing a pellicle assembly, the method comprising:
temporarily attaching a carbon-containing thin film onto a transfer membrane using a liquid in a liquid environment,
wherein attaching the carbon-containing thin film onto the transfer membrane in the liquid environment includes dipping the carbon-containing thin film in the liquid, and attaching the carbon-containing thin film onto the transfer membrane while at least a portion of the carbon-containing thin film is dipped in the liquid;
attaching the carbon-containing thin film onto one surface of a pellicle frame in a gas environment while the carbon-containing thin film is attached onto the transfer membrane,
separating the transfer membrane from the carbon-containing thin film while the carbon-containing thin film is attached onto the pellicle frame, and
fixing a photomask to another surface of the pellicle frame.

16. The method as claimed in claim 15, further comprising, before attaching the carbon-containing thin film onto the transfer membrane, forming a handling thin film on the carbon-containing thin film, wherein attaching carbon-containing thin film onto the transfer membrane includes attaching the carbon-containing thin film onto the transfer membrane while the carbon-containing thin film is spaced apart from the transfer membrane with the handling thin film between the carbon-containing thin film and the transfer membrane.

17. The method as claimed in claim 16, further comprising, after separating the transfer membrane from the carbon-containing thin film, removing the handling thin film from the carbon-containing thin film.

18. The method as claimed in claim 15, further comprising, after separating the transfer membrane from the carbon-containing thin film, decreasing a thickness of the carbon-containing thin film.

19. The method as claimed in claim 15, wherein:
the transfer membrane includes a plurality of pores, and
attaching the carbon-containing thin film onto the transfer membrane includes attaching the carbon-containing thin film onto the transfer membrane using a surface tension and a capillary phenomenon of the liquid.

* * * * *